United States Patent [19]
Laudon et al.

[11] Patent Number: 5,790,447
[45] Date of Patent: Aug. 4, 1998

[54] HIGH-MEMORY CAPACITY DIMM WITH DATA AND STATE MEMORY

[75] Inventors: James P. Laudon, Menlo Park; Daniel E. Lenoski, San Jose; John Manton, Mountain View, all of Calif.

[73] Assignee: Silicon Graphics, Inc., Mountain View, Calif.

[21] Appl. No.: 747,975

[22] Filed: Nov. 12, 1996

Related U.S. Application Data

[63] Continuation of Ser. No. 440,214, May 15, 1995, abandoned.

[51] Int. Cl.⁶ ............................................. G11C 5/06
[52] U.S. Cl. ........................... 365/52; 365/230.03; 365/63
[58] Field of Search ........................... 365/200, 51, 63, 365/72, 52

[56] References Cited

U.S. PATENT DOCUMENTS

| | | | |
|---|---|---|---|
| 4,610,000 | 9/1986 | Lee | 365/200 |
| 4,656,605 | 4/1987 | Clayton | 395/52 |
| 4,727,513 | 2/1988 | Clayton | 365/52 |
| 4,802,119 | 1/1989 | Heene et al. | 364/900 |
| 5,089,993 | 2/1992 | Neal et al. | 365/52 X |
| 5,124,948 | 6/1992 | Takizawa et al. | 364/200 |
| 5,126,910 | 6/1992 | Windsor et al. | |
| 5,164,916 | 11/1992 | Wu et al. | |
| 5,200,917 | 4/1993 | Shaffer et al. | |
| 5,214,570 | 5/1993 | Shah et al. | |
| 5,272,664 | 12/1993 | Alexander et al. | |
| 5,274,788 | 12/1993 | Koike | |
| 5,319,591 | 6/1994 | Takeda et al. | |
| 5,367,494 | 11/1994 | Shebanow et al. | |
| 5,513,135 | 4/1996 | Dell et al. | 365/52 |

FOREIGN PATENT DOCUMENTS

| | | |
|---|---|---|
| 246 025 | 11/1987 | European Pat. Off. |
| 571092 | 11/1993 | European Pat. Off. |
| 59-52483 | 3/1984 | Japan |

OTHER PUBLICATIONS

Brewer, T., A Highly Scalable System Utilizing Up To 128 PA-RISC Processors, IEEEE, 1995, pp. 133–140.

Chaiken, D. et al., LimitLESS Directories: A Scanable Cache Coherence Scheme, 1991 ACM, pp. 224–234.

Lenoski, D. et al., "The Standford Dash Multiprocessor", IEEE, Mar. 1992, pp. 63–79.

Primary Examiner—Joseph A. Popek
Attorney, Agent, or Firm—Sterne, Kessler, Goldstein & Fox P.L.L.C.

[57] ABSTRACT

A high memory capacity dual in-line memory modules (DIMM) for use in a directory-based, distributed shared memory multiprocessor computer system includes a data memory for storing data and a state memory for storing state or directory information corresponding to at least a portion of the data. The DIMM allows the data and the state information to be accessed independently. The DIMM can be configured in a plurality of storage capacities.

76 Claims, 13 Drawing Sheets

| PAD | NAME | PAD | NAME | PAD | NAME | PAD | NAME | PAD | NAME | PAD | NAME |
|---|---|---|---|---|---|---|---|---|---|---|---|
| 1 | DIR_DQ13 | 42 | DQ49 | 85 | DQ30 | 131 | DIR_A0 | 174 | V3 | 218 | DQ23 |
| 2 | GND | 43 | DQ50 | 86 | GND | 132 | V3 | 175 | A11 | 219 | GND |
| 3 | DUR_DQ15 | 44 | GND | 88 | DQ24 | 133 | DIR_A10 | 177 | GND | 220 | DQ17 |
| 4 | DIR_DQ11 | 45 | DQ45 | 89 | V3 | 134 | DIR_RE_ | 178 | A8 | 221 | DQ19 |
| 5 | V3 | 46 | DQ46 | 90 | DQ27 | 135 | GND | 179 | A6 | 222 | V3 |
| 6 | DIR_DQ8 | 47 | V3 | 91 | DQ20 | 136 | DIR_DQM | 180 | V3 | 224 | DQ12 |
| 7 | DIR_A3 | 48 | DQ41 | 92 | GND | 137 | DIR_A2 | 181 | CS0_ | 225 | GND |
| 8 | GND | 49 | DQ42 | 93 | GND | 138 | V3 | 182 | CS1_ | 226 | GND |
| 9 | DIR_A11 | 50 | GND | 94 | DQ22 | 139 | DIR_DQ0 | 183 | GND | 227 | DQ14 |
| 10 | DIR_CS_ | 51 | DQ43 | 95 | V3 | 140 | DIR_DQ2 | 184 | CE_ | 228 | V3 |
| 11 | V3 | 52 | CKE0 | 96 | V3 | 141 | GND | 185 | P_CLK | 229 | V3 |
| 12 | DIR_WE_ | 53 | V3 | 97 | DQ16 | 142 | DIR_DQ5 | 186 | V3 | 230 | DQ8 |
| 13 | DIR_CE_ | 54 | A10 | 98 | GND | 143 | DIR_DQ6 | 187 | A5 | 231 | GND |
| 14 | GND | 55 | A9 | 99 | DQ18 | 144 | V3 | 188 | PLL_EN | 232 | DQ10 |
| 15 | DIR_A4 | 56 | GND | 101 | V3 | 145 | DIR_A7 | 189 | GND | 234 | V3 |
| 16 | DIR_DQ1 | 57 | A7 | 103 | DQ13 | 146 | DIR_A6 | 190 | DQM | 235 | DQ4 |
| 17 | V3 | 58 | CKE1 | 104 | GND | 147 | GND | 191 | A4 | 236 | GND |
| 18 | DIR_DQ3 | 59 | V3 | 105 | GND | 148 | DIR_CKE | 192 | V3 | 237 | GND |
| 19 | DIR_DQ4 | 60 | TCLK | 106 | DQ15 | 149 | DQ68 | 193 | A1 | 238 | DQ6 |
| 20 | GND | 61 | PLL_CLR | 107 | V3 | 150 | V3 | 194 | A2 | 240 | V3 |
| 21 | DIR_DQ7 | 62 | GND | 108 | V3 | 151 | DQ71 | 195 | GND | 241 | DQ1 |
| 22 | DIR_A5 | 63 | P_CLK_ | 109 | DQ9 | 152 | DQ64 | 196 | DQ37 | 242 | DQ3 |
| 23 | V3 | 64 | RE_ | 110 | GND | 153 | GND | 197 | DQ38 | 243 | GND |
| 24 | DIR_A8 | 65 | V3 | 111 | DQ11 | 154 | DQ67 | 198 | V3 | 244 | GND |
| 25 | DIR_A9 | 66 | TCLK_SEL | 113 | V3 | 155 | DQ56 | 199 | DQ32 | | |
| 26 | GND | 67 | WE_ | 114 | DQ5 | 156 | V3 | 200 | DQ34 | | |
| 27 | DQ69 | 68 | GND | 115 | GND | 157 | DQ62 | 201 | GND | | |
| 28 | DQ70 | 69 | A3 | 116 | GND | 158 | DQ60 | 202 | GND | | |
| 29 | V3 | 70 | A0 | 117 | DQ7 | 159 | GND | 204 | V3 | | |
| 30 | DQ65 | 71 | V3 | 118 | DQ0 | 160 | DQ59 | 205 | V3 | | |
| 31 | DQ66 | 73 | DQ36 | 119 | V3 | 161 | DQ52 | 206 | DQ29 | | |
| 32 | GND | 74 | GND | 120 | DQ2 | 162 | V3 | 207 | GND | | |
| 33 | DQ57 | 76 | DQ39 | 122 | GND | 163 | DQ55 | 208 | DQ31 | | |
| 34 | DQ63 | 77 | V3 | 123 | GND | 164 | DQ48 | 210 | V3 | | |
| 35 | V3 | 78 | DQ33 | 124 | DIR_DQ12 | 165 | GND | 211 | DQ25 | | |
| 36 | DQ61 | 79 | DQ35 | 125 | DIR_DQ14 | 166 | DQ51 | 212 | DQ26 | | |
| 37 | DQ58 | 80 | GND | 126 | V3 | 167 | DQ44 | 213 | GND | | |
| 38 | GND | 81 | GND | 127 | DIR_DQ10 | 168 | V3 | 214 | GND | | |
| 39 | DQ53 | 82 | DQ28 | 128 | DIR_DQ9 | 169 | DQ47 | 215 | DQ21 | | |
| 40 | DQ54 | 83 | V3 | 129 | GND | 170 | DQ40 | 216 | V3 | | |
| 41 | V3 | 84 | V3 | 130 | DIR_A1 | 171 | GND | 217 | V3 | | |

FIG. 15

HIGH-MEMORY CAPACITY DIMM WITH DATA AND STATE MEMORY

This application is a continuation of application Ser. No. 08/440,214, filed May 15, 1995, now abandoned.

CROSS-REFERENCE TO RELATED APPLICATION

This application is related to commonly owned, co-pending U.S. patent application No. 08/440,967, filed May 15, 1995, entitled "DIMM Pair with Data Memory and State Memory," which is incorporated herein by reference.

BACKGROUND OF THE INVENTION

1. Field of the Invention

The present invention relates generally to the field of computer memory, and more particularly, to a dynamic random access memory dual in-line memory module.

2. Related Art

Dynamic, random access memory (DRAM) single in-line memory modules (SIMMs) and dual in-line memory modules (DIMMs) are preferred implementations of semiconductor main memory in computer systems of all sizes, including personal computers (PCs), workstations, supercomputers and the like. Both SIMMs and DIMMs include a printed circuit board (PCB) having an edge connector with a plurality of signal pads on opposite sides of the PCB for physical and electrical connection to a connector socket. DRAM or synchronous DRAM integrated circuit chips are mounted on the PCB, and are electrically connected to various connector signal pads. A SIMM has opposing signal pads electrically connected so that each pair carries a single signal. In a DIMM, opposing pads are not connected so that each pad can carry a separate signal. However, the terms SIMM and DIMM are often used synonymously in the memory art. A detailed description of a known DRAM SIMM can be found in commonly owned U.S. Pat. No. 5,272,664 to Alexander et al., the full text of which is incorporated herein by reference.

In a multiprocessor computer system, main memory may be implemented as distributed shared memory or centralized (i.e., non-distributed) memory. Each processor generally has a local cache. Thus, the processors must maintain cache coherence. Most existing multiprocessors with cache coherence rely on snooping to maintain coherence. To accomplish this, all processors are connected to a common bus. The processors "snoop" the bus. That is, the information about which processors are caching which data items is distributed among all of the caches. Thus, straightforward snooping schemes require that all caches see every memory request from every processor. This inherently limits the scalability of these systems because the common bus and the individual processor caches eventually saturate. With today's high-performance RISC processors, this saturation can occur with just a few processors.

Directory structures avoid the scalability problems of snoopy schemes by removing the need to broadcast every memory request to all processor caches. The directory maintains pointers to the processor caches holding a copy of each memory block. Only the caches with copies can be affected by an access to the memory block, and only those caches need be notified of the access. Thus, the processor caches and interconnect will not saturate due to coherence requests. Furthermore, directory-based coherence is not dependent on any specific interconnection network like the bus used by most snooping schemes.

Few DSM multiprocessors that use directory structures have been developed. Examples of such DSM systems include Stanford University's Dash multiprocessor described in Lenoski, Daniel, et al., "The Stanford Dash Multiprocessor," *IEEE*, pp. 63–79, March 1992; Massachusetts Institute of Technology's (MIT) Alewife multiprocessor described in Chaiken, David, et al., "LimitLESS Directories: A Scalable Cache Coherence Scheme," *ACM*, pp. 224–234, 1991; and Convex Computer Corporation's Exemplar multiprocessor described in Brewer, Tony, "A Highly Scalable System Utilizing up to 128 PA-RISC Processors," *IEEE*, pp. 133–140, 1995.

In the Stanford Dash multiprocessor, the main memory was hardwired for maximum memory capacity.1 In the MIT multiprocessor and the Convex Computer Corporation multiprocessor, directory information was stored in main memory. Thus, the data and the directory information had to be accessed sequentially, limiting memory bandwidth.

What is needed is a technique for implementing main memory in a DSM multiprocessor computer system in a manner such that directory information is accommodated and such that straightforward memory expansion of both data memory and directory memory are concurrently supported.

SUMMARY OF THE INVENTION

The invention is a dual in-line memory module (DIMM) including a circuit board, and first and second memories mounted on the circuit board. The first memory is configured for storing data and is also called a data memory. The second memory, called a state memory, is configured for storing state information corresponding to at least a portion of the data stored in the data memory. State information includes, for example, cache coherence information (i.e., information on whether and where a block of data is cached, and where the most recent copy of the data resides), information regarding access rights to the data in the data memory, page migration information, and the like. The DIMM of the invention allows the state information in the state memory to be accessed separately from the data in the data memory. By "separately," it is meant that the state information can be read/written independently of and/or in parallel with data stored in the data memory.

A plurality of the DIMMs of the invention can be used to implement main memory in a distributed, shared memory (DSM) multiprocessor. The DIMM configuration provides a mechanism through which memory can be easily upgraded or replaced. Because the state information is stored on the DIMMs along with the data, an optimal memory management scheme is provided.

In a first embodiment, each DIMM provides 32 megabytes of data storage capacity and 4 megabytes of ECC (error correcting codes) in the data memory. To achieve this, the DIMM includes two memory bank portions (one per side of the DIMM circuit board) of two megabits deep by 72 bits wide (2M×72). Of the 72 bits, 64 bits are for data and eight bits are for ECC. The state memory includes one megabit by 16 bits wide (1M×16) of state information capacity. This embodiment can be implemented using a plurality of synchronous, dynamic, random access memory (SDRAM) chips.

In this embodiment, the circuit board of the DIMM is approximately 1.34 inches high by 6.6 inches long (note that the width dimension is given as a height, since DIMM boards are generally mounted perpendicular to another circuit board via an edge connector) and includes a 122 pad long by 2 pad wide edge connector along one longitudinal edge of the circuit board. The data memory is implemented using eighteen (18) two megabit by eight bit (2M×8) SDRAM chips. Nine of the SDRAM chips are mounted on a front side of the circuit board, and nine are mounted on a back side of the circuit board. The state memory is implemented using a single one megabit by sixteen bit (1M×16) SDRAM chip that is mounted on the front side of the circuit board.

The 244 pads of the edge connector provide separate data and address pads for the data memory and the state memory to allow each memory to be accessed independently and, if desired, in parallel. An address and control buffer is provided on each side of the circuit board. Each address and control buffer provides buffering for all address and control lines to the SDRAM chips for half of the data memory. In addition, a single clock driver is provided for all of the SDRAM chips of the DIMM. The clock driver provides two important functions. First, the clock driver provides sufficient drive current capacity to drive each SDRAM chip without unduly loading the source of the clock signal. Second, the clock driver provides a phase lock loop function to eliminate any skew or delay introduced by the buffering/driving circuitry of the clock driver.

In a second embodiment, each DIMM provides 64 megabytes of data storage capacity and 8 megabytes of ECC for a total of 72 megabytes of data storage in the data memory. To achieve this, the DIMM includes two memory bank portions of four megabits deep by 72 bits wide (4M×72). The state memory includes two megabit by 16 bits wide (2M×16) of state information capacity.

In this embodiment, the data memory is implemented using thirty-six (36) four megabit by four bit (4M×4) SDRAM chips. This implementation requires a second circuit board mounted in a piggy-back fashion on the first circuit board. Eighteen of the SDRAM chips of the data memory are mounted on the first circuit board, substantially as set forth in the first embodiment, while the other eighteen SDRAM chips are mounted on the piggy-back board in a similar fashion. The state memory is implemented using two (2) two megabit by eight (2M×8) bit SDRAM chips. One of the chips is mounted on each side of the first circuit board. Similar to the 36 megabyte embodiment, the first circuit board in the 72 megabyte embodiment includes a single clock driver and two address and control buffers. In addition, the piggy-back board includes its own single clock driver and pair of address and control buffers.

The invention utilizes the DIMM in a DIMM memory pair. A first DIMM of the pair includes a first data memory having first and second memory bank portions for storing data, and a first state memory configured to store state information corresponding to data stored in a first memory bank. A second DIMM of the pair includes a second data memory having third and fourth memory portions for storing data and a second state memory configured to store state information corresponding to data stored in a second memory bank. The first memory bank is formed from the first memory bank portion of the first DIMM and the third memory bank portion of the second DIMM. The second memory bank is formed from the second memory bank portion of the first DIMM and the fourth memory bank portion of the second DIMM. For example, if the first memory bank portion represents the front side of the first DIMM, the second memory bank portion represents the back side of the first DIMM, the third memory bank portion represents the front side of the second DIMM, and the fourth memory bank portion represents the back side of the second DIMM, then the first memory bank is represented as the front sides of the first and second DIMMs, while the second memory bank portion is represented by the back sides of the first and second DIMMs.

This DIMM pair configuration optimally provides a very wide data-word DIMM, which is implemented without imposing unwieldy requirements on the physical configuration of the edge connector of the DIMM. For example, each DIMM includes a 244 pad edge connector in the preferred embodiment. Using this connector, each DIMM provides a 72-bit-wide data path. Thus, the DIMM pair provides a 144-bit-wide data word. In the first embodiment described above, the 144-bit data word is provided in a DIMM pair with 64 megabytes of data storage capacity and 8 megabytes for ECC. In the second embodiment described above, the 144-bit data word is provided in a DIMM pair with 128 megabytes of data storage capacity and 16 megabytes for ECC.

When used in a DSM multiprocessor, the DIMM pairs of the invention are used to implemented main memory. Each processor node of the DSM multiprocessor includes a portion of main memory. In the 36 megabyte and 72 megabyte embodiments of the DIMM, the state memory configurations discussed provide sufficient capacity to accommodate the state information required for a system having a limited number of nodes (e.g., 16 nodes). For example, each state memory described above includes 16 bit wide words of state information.

When the number of nodes exceeds 16, more processors and caches will be present. Additional state data is required to keep track of the additional caches. Accordingly, more bits are required in the state memory to accommodate the extra nodes. The additional state memory can be provided by a state memory-only DIMM. This DIM adds 32 bits of additional state memory. The resulting state memory provides 48 bit wide words of state information. With the additional state memory, the DSM multiprocessor can accommodate up to 64 nodes using conventional bit-vectors and up to 512 nodes using flexible directory bit vectors.

Thus, for a DSM multiprocessor having 16 nodes or less, the DIMM of the invention allows a directory-based memory structure to be implemented/upgraded using a single type of DIMM, configured in pairs. For a DSM multiprocessor having 512 nodes or less, the DIMM of the invention allows a directory-based memory structure to be implemented/upgraded using the DIMM pair of the invention and a state memory-only DIMM to expand state memory. In this manner, the DIMM of the invention provides significant advantages. First, when upgrading the number of processors, it is not necessary to replace existing DIMMs. Instead, existing DIMMs are merely supplemented with additional DIMMs and/or state memory-only DIMMs. Second, smaller systems need only one DIMM pair, not a DIMM pair plus a state memory-only DIMM, which reduces the cost of these systems. Third, because a single identical DIMM board, and in some instances a state memory-only DIMM board also, are used to implement main and directory/state memory, it is not necessary to manufacture, stock and distribute many different types of memory assemblies.

For purposes of illustration, a 36 megabyte embodiment and a 72 megabyte embodiment of the DIMM have been described. It should be understood, however, that the DIMM of the invention may be produced in other data capacities. For example, using 64 megabit (i.e., 8M×8) SDRAM chips, a single board DIMM may be produced having 128 megabyte data and 16 megabyte ECC (18 chips×8 megabytes per chip) storage capacity (including data and ECC). This would yield a DIMM pair having 256 megabytes of data storage capacity. If a piggy-back board is used as in the 72 megabyte DIMM embodiment described above, the 64 megabyte SDRAM chips can be used to implement a 256 megabyte data and 32 megabyte ECC DIMM and a 512 megabyte data, 64 megabyte ECC DIMM pair.

In the preferred embodiment described, a piggy-back board is used to allow the DIMM to accommodate 36 SDRAMs for the data memory. A person skilled in the art will recognize that chip stacking techniques may also be used to accommodate 36 SDRAM chips. If chip stacking techniques are used, the piggy-board may be eliminated.

The foregoing and other features and advantages of the invention will be apparent from the following, more particular description of several preferred embodiments of the invention, as illustrated in the accompanying drawings.

BRIEF DESCRIPTION OF THE FIGURES

The invention will be better understood if reference is made to the accompanying drawings in which:

FIG. 15 illustrates a preferred exemplary pad assignment for an entire edge connector.

In the drawings, like reference numbers indicate identical or functionally similar elements. Additionally, the left-most digit of the reference number identifies the drawing in which the reference number first appears.

DETAILED DESCRIPTION OF THE PREFERRED EMBODIMENTS

Table of Contents

I. Overview
II. Architecture of the DIMM
III. Implementation of the DIMM in a DIMM Pair
IV. Details of the DIMM Interconnects
V. DIMM Chip Layout
VI. The Pad Description
VII. Timing Requirements
VIII. Waveform Diagrams
XI. Expanded State Memory
X. Conclusion I. Overview The preferred embodiments of the invention are now described with reference to the figures. While specific steps, configurations and arrangements are discussed, it should be understood that this is done for illustrative purposes only. A person skilled in the relevant art will recognize that other steps, configurations and arrangements can be used without departing from the spirit and scope of the invention.

In a distributed, shared memory (DSM) multiprocessor such as that described in commonly-owned, co-pending U.S. patent application Ser. No. 08/435,456, filed May 5, 1995, entitled "System and Method For Network Exploration and Access in a MultiProcessor Environment," main computer memory is distributed across a processor network. Each distributed portion (node) of the main memory can be associated with one or more local processors. In such a system, memory management becomes quite complex. The DSM multiprocessor described in the above-identified application implements a directory-based cache coherence scheme that simplifies memory management. The directory-based memory management system is described in the following commonly-owned, copending patent applications:

U.S. patent application Ser. No. 08/435,460, filed May 5, 1995"Directory-Based Coherence Protocol Allowing Efficient Dropping of Clean-Exclusive Data,"

U.S. patent application Ser. No. [to be assigned], filed May 5, 1995, entitled "System and Method For a Multiprocessor Partitioning to Support High Availability,"

U.S. patent application Ser. No. 08/435,464, filed May 5, 1995, entitled "Page Migration In a Non-Uniform Memory Access (NUMA) System,"

U.S. patent application Ser. No. 08/435,459, filed May 5, 1995, entitled "System and Method For Maintaining Coherency of Virtual-to-Physical Memory Translations in a Multiprocessor Computer," and U.S. patent application Ser. No. 08/435,463, filed May 5, 1995, entitled "Cache Coherency Using Flexible Directory Bit Vectors. "

The present invention is a dual in-line memory module (DIMM) for implementing a main memory in a DSM such as that described in the above-referenced patent applications. Advantageously, the invention provides both data memory and state memory on a DIMM. This facilitates installation, replacement, expansion, testing and extension of the distributed main memory.

II. Architecture of the DIMM

Figure 1:
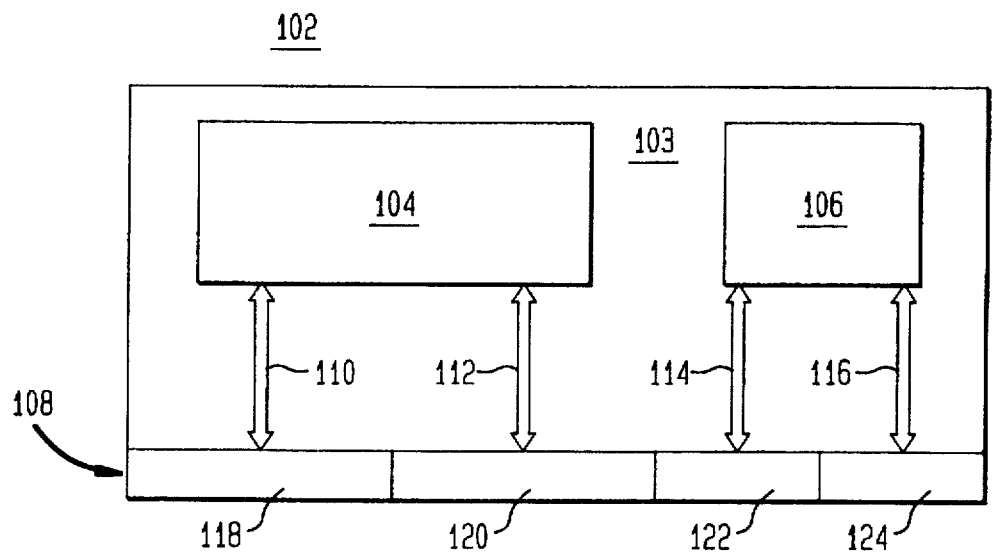
FIG. 1 is a representative high level block diagram of a SDRAM DIMM according to the present invention.

FIG. 1 is a high-level, function block diagram of a DIMM 102 of the invention. DIMM 102 includes a printed circuit board 103, a data memory 104, and a state memory 106. Circuit board 103 is a multilayer (e.g., eight layer) printed circuit board having an edge connector 108. Edge connector 108 typically provides all electrical communications for data memory 104 and state memory 106. Edge connector 108 is configured for being inserted into a connector socket (not shown) such as socket part number ELF244LFCE-4Z50, available from Burndy Corporation, Norwalk, Conn.

Edge connector 108 provides a plurality of data pads 118 that allow data access to data memory 104 via data path 110, a plurality of address pads 120 for communicating address and control information to data memory 104 via address and control path 112, a plurality of data pads 122 that allow data access to state memory 106 via data path 114, and a plurality of address pads 124 for communicating address and control information to state memory 106 via address and control path 116. By "access" to a memory, it is meant to read data from or write data to the memory.

Data memory 104 is configured to store data. The data stored in data memory 104 is generally portioned into data blocks. State memory 106 is configured to store state information corresponding to blocks of data in data memory 104. State information (also known as directory information) includes, for example, cache coherence information (i.e., information on whether and where a block of data is cached, and where the most recent copy of the data resides), information regarding access rights to the data in the data memory, page migration information, and the like. Because connector 108 provides separate address and data pads for state memory 106 and data memory 104, the data and corresponding state information can be separately accessed. By "separately," it is meant that the state information can be read/written independent from and/or in parallel with data being read/written from/to the data memory. This allows the data and state information to be accessed simultaneously.

Figure 2:
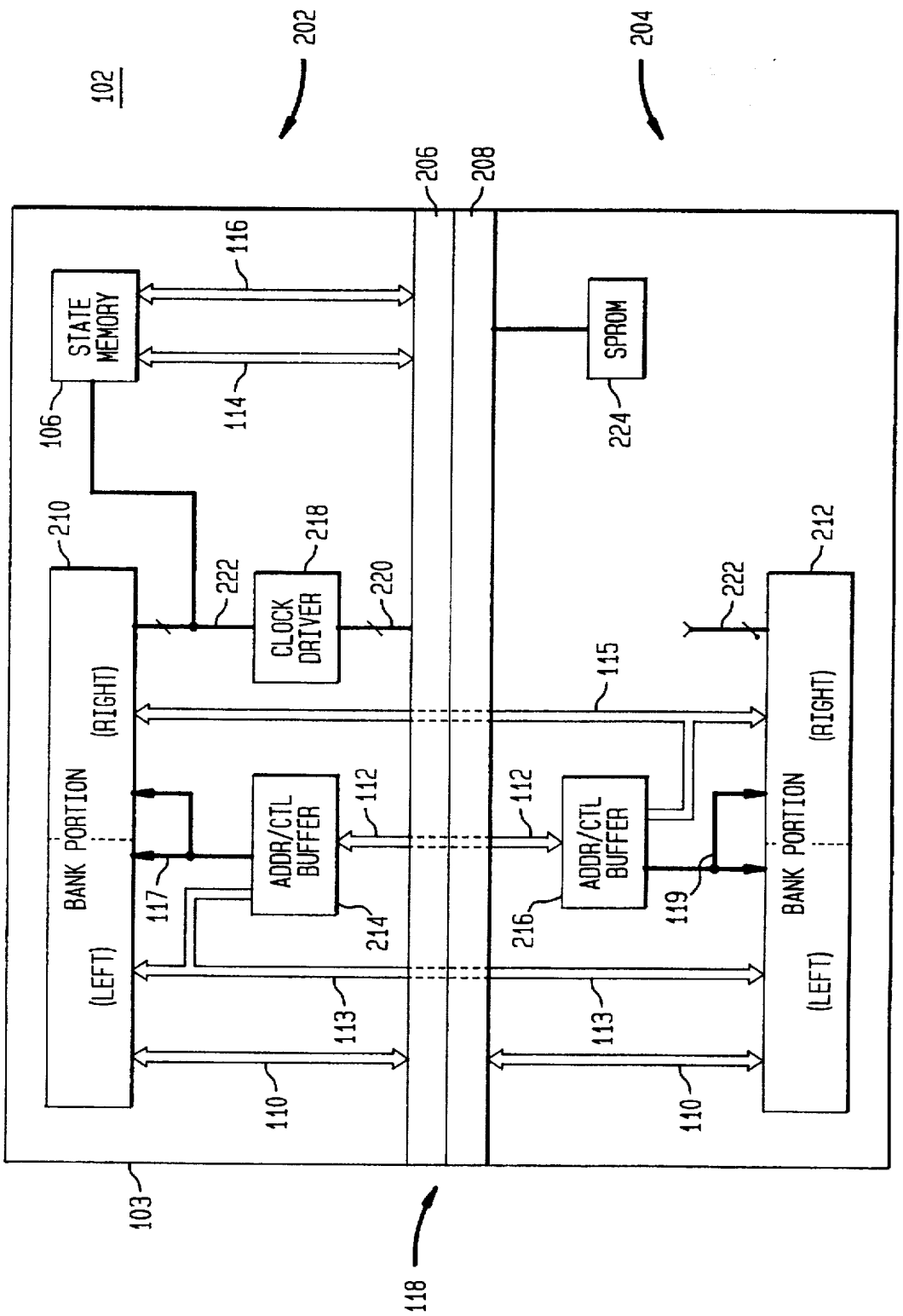
FIG. 2 is a representative schematic block diagram of the front and back of a SDRAM DIMM according to the present invention.

FIG. 2 illustrates a more detailed functional block diagram of DIMM 102. In this functional representation, both a front side 202 and a back side 204 are illustrated. Connector 118 is depicted between front side 202 and back side 204. This figure can be best understood by viewing the DIMM like a book that has been opened such that the binding is situated in the center, with both the front and back covers being visible. Connector 118 is analogous to the binding of the book. As illustrated, connector 118 includes a first row of connector pads 206 on front side 202 and a second row of connector pads 208 on back side 204 of circuit board 103.

As illustrated in this figure, data memory 104 is implemented by a first bank portion 210 on front side 202 and a second bank portion 212 on back side 204. State memory 106 is shown mounted on front side 202. Address and control path 112 is buffered by address and control buffers 214,216. Address and control buffer 214 provides address and control signals (i.e., row address strobe, column address strobe, write enable and data mask) to a left side of first bank portion 210 and a left side of second bank portion 212 via bus 113. In addition, address and control buffer 214 provides a chip select signal and a clock enable signal to both the left and right sides of first bank portion 210 via lines 117.

Similarly, address and control buffer 216 provides address and control signals (i.e., row address strobe, column address strobe, write enable and data mask) to a right side of first bank portion 210 and a right side of second bank portion 212 via bus 115. In addition, address and control buffer 216 provides a chip select signal and a clock enable signal to both the left and right sides of second bank portion 212 via lines 119. The chip select signals are used to select between first bank portion 210 and second bank portion 212. Buffers 214,216 are arranged to buffer left and right sides of memory bank portions 210,212 to simplify routing of the signal lines on circuit board 103. Alternatively, buffer 214 may be configured to buffer signals only for bank portion 210, and buffer 216 may be configured to buffer signals only for bank portion 212.

A clock driver 218 is mounted on front side 202 of circuit board 103. Clock driver 218 receives a clock signal from clock signal and control lines 220 and provides sufficient drive current for clock driver 218 to drive a plurality of memory chips that are used to form first and second memory bank portions 210,212 as well as state memory 106. Clock driver 218 also includes a phase-lock loop function that eliminates skew from a clock signal 222, which is being distributed to the various memory chips of the data and state memories on DIMM 102.

In one embodiment, back side 204 of DIMM 102 includes an SPROM (serial programmable read only memory) 224. SPROM 224 can be used to provide a unique identification number (e.g., a serial number) for DIMM 102. A suitable SPROM is available from Dallas Semiconductor, Dallas, Tex., as Part No. DS2502, which is also known as a NIC (Number In a Can).

III. Implementation of the DIMM in a DIMM Pair

Figure 3:
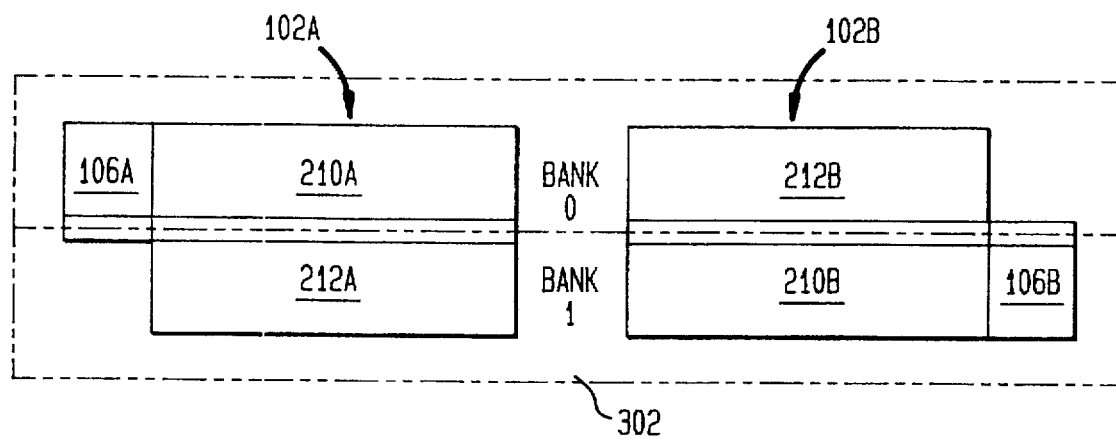
FIG. 3 is a representative logic diagram of a SDRAM DIMM pair having two banks and the state directory memory for those banks according to the present invention.

In a preferred embodiment of the invention, DIMM 102 is used to implement main computer memory only in pairs. Each DIMM of the pair provides half of a data word, such that the pair together is able to provide a very wide data word. This is illustrated in FIG. 3, in which a DIMM 102A and a DIMM 102B form a DIMM pair 302. As illustrated, DIMM 102A includes first memory bank portion 210A, second memory portion 212A, and first state memory 106A. Similarly, DIMM 102B includes first memory bank portion 210B, second memory bank portion 212B, and second state memory 106B.

In this implementation, first memory bank portion 210A and second memory bank portion 212B form a first memory bank, labeled bank 0. State information for data stored in bank 0 is maintained in state memory 106A. Second memory bank portion 212A and first memory bank portion 210B form a second memory bank, labeled bank 1. State memory 106B is configured to store state information corresponding to data stored in memory bank 1. As discussed in further detail below, a bank select signal is used to select one of bank 0 or bank 1 for data access operations. Memory bank 0 and memory bank 1 share common address and data lines.

The DIMM of the invention can be produced with a variety of different data storage capacities. In a first preferred embodiment, DIMM 102 has a thirty-six (36) megabyte data storage capacity (including 32 megabytes of data and 4 megabytes of ECC) and a two (2) megabyte state information storage capacity. This embodiment yields a DIMM pair having sixty-four (64) megabytes of data storage capacity, eight (8) megabytes of ECC, and four (4) megabytes of state information storage capacity. In a second embodiment, DIMM 102 has a seventy-two (72) megabyte data storage capacity (including 64 megabytes of data and 8 megabytes of ECC) and a four (4) megabyte state information storage capacity. This embodiment yields a DIMM pair having one hundred twenty-eight (128) megabytes of data storage capacity, sixteen (16) megabytes of ECC, and eight (8) megabytes of state information storage capacity.

IV. Details of the DIMM Interconnects

Figure 4:
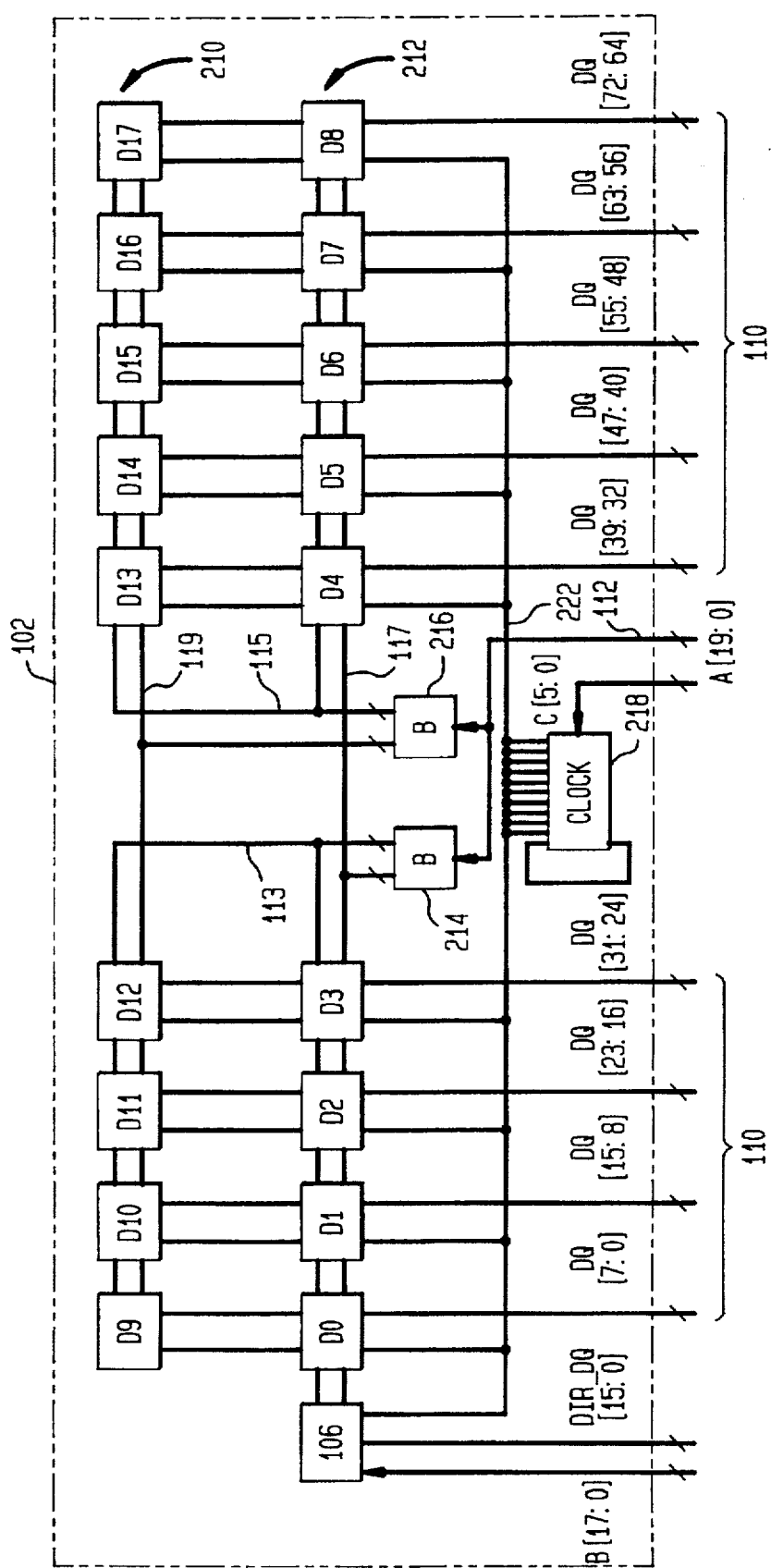
FIG. 4 is a representative schematic diagram of a 36 megabyte SDRAM DIMM according to a first embodiment of the present invention.

FIG. 4 is a block diagram illustrating interconnection of the components used to implement a DIMM 102 in accordance with the first preferred embodiment of the invention. Data memory 104 is implemented using a plurality of synchronous, dynamic, random access memory (SDRAM) chips D0–D17. SDRAMs D0–D8 represent memory chips of first memory bank portion 210, while SDRAMs D9–D17 represent memory chips of second memory bank portion 212. In this 32 megabyte embodiment of DIMM 102, each SDRAM D0–D17 is a two megabit by eight bit (2M×8) SDRAM chip. Thus, each memory bank portion 210,212 is two (2) megabits deep by seventy-two (72) bits wide, yielding a total data capacity for data memory 104 of four (4) megabits deep by seventy-two (72) bits wide (i.e., 64 bits for data and 8 bits for ECC). State memory 106 is implemented using a single one megabit by sixteen (1M×16) bit SDRAM chip.

Each DRAM chip D0–D17 provides an 8-bit data word. To accommodate communications with each SDRAM, data path 110 provides an 8-bit data path DQ. As indicated, one chip from each of memory bank portions 210,212 is connected to an 8-bit data path DQ. For example, SDRAM D0 and SDRAM D9 are both connected to DQ[7:0]. Which chip is actually active on the data path is determined by an external chip or bank select signal (discussed below).

Address and control buffers 214,216 receive 20-bits of address and control signals, labeled A[19:0], buffers the address and control signals, and provides the address and control signal to SDRAMs D0–D17 as follows. Address and control buffer 214 provides address and control signals (i.e., row address strobe, column address strobe, write enable and data mask) to left sides of bank portions 210,212 (i.e., SDRAMs D0–D3 and D9–D12) via bus 113. In addition, address and control buffer 214 provides a bank select signal (CS0_) and a clock enable signal (CKE0) to both the left and right sides of first bank portion 210 (i.e., SDRAMS D0–D8) via lines 117.

Address and control buffer 216 provides address and control signals (i.e., row address strobe, column address strobe, write enable and data mask) to right sides of bank portions 210,212 (i.e., SDRAMs D4–D8 and D13–D17) via bus 115. In addition, address and control buffer 216 provides a bank select signal (CS1_) and a clock enable signal (CKE1) to both the left and right sides of second bank portion 212 (i.e., SDRAMS D9–D17) via lines 119. Address and control signals A[19:0] are described further below in Table 1.

Clock driver circuit 218 provides clock signal 222 to each of SDRAMs D0–D17 and to the SDRAM of state memory 106. Clock driver circuit 218 generates clock signal 222 based on clock control signals C[5:0]. The clock control signals C[5:0] are described in further detail below. The data path 114 and address and control path 116 of state memory 106 are illustrated by lines DIR_DQ[15:0] and B[17:0], respectively. These signals are also described in further detail below.

Figure 5:
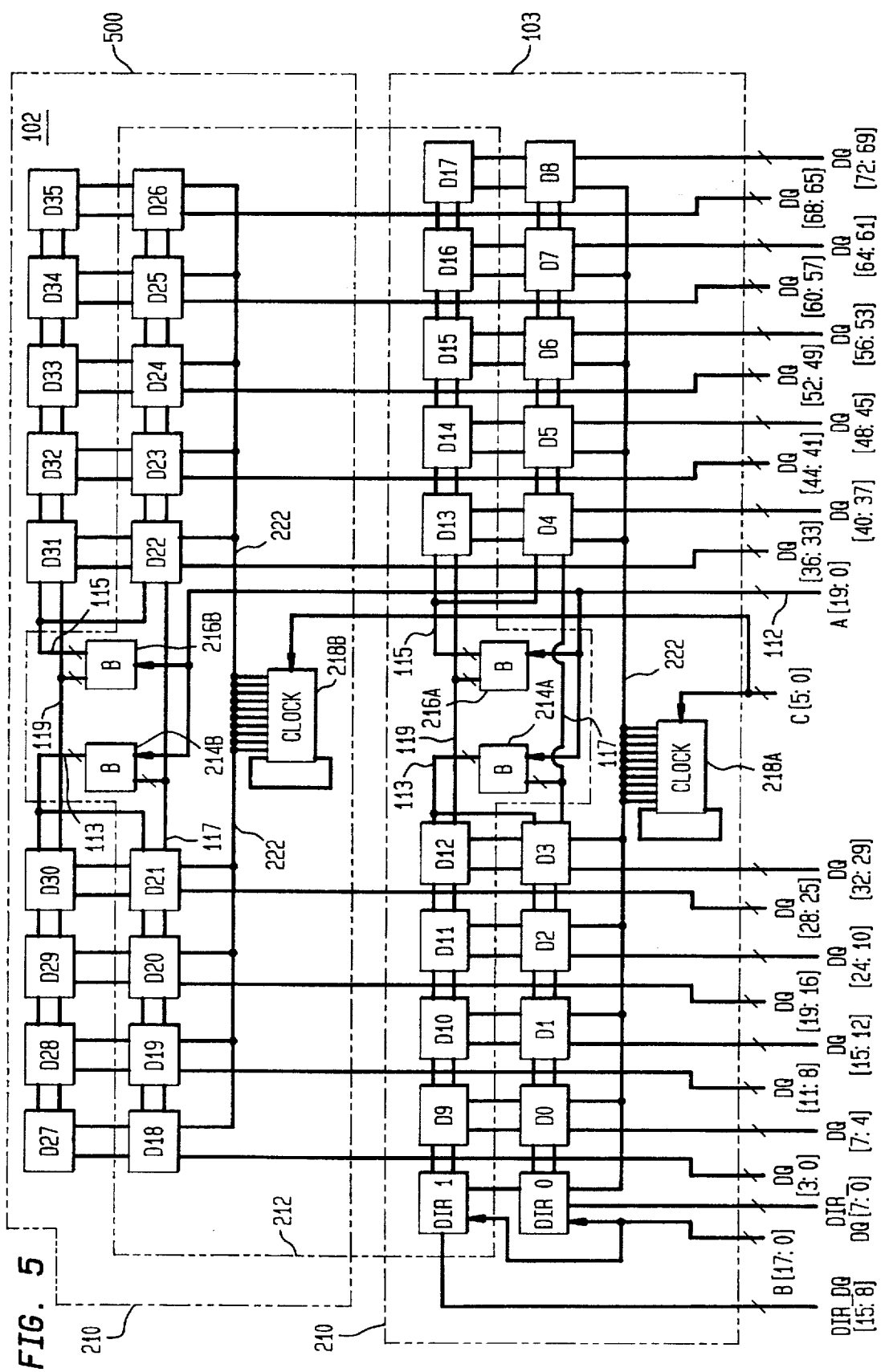
FIG. 5 is a representative schematic diagram of a 72 megabyte SDRAM DIMM according to a second embodiment of the present invention.

The 72 megabyte embodiment of DIMM 102 is depicted in FIG. 5. In this embodiment, rather than using eighteen two megabit by eight bit (2M×8) SDRAMs, the DIMM is implemented using thirty-six (36) four megabit by 4 bit (4M×4) SDRAMs. To accommodate the additional chips, a second circuit board 500 is used. Eighteen of the 4M×4 SDRAMs (D0–D17) are mounted on a first circuit board 103. The other eighteen 4M×4 SDRAMs (D18–D35) are mounted on second circuit board 500. Circuit board 500 is mounted on circuit board 103 in a piggy-back fashion. Only circuit board 103 includes edge connector 108 (not shown in FIG. 5). All electrical connections to the SDRAM chips of circuit board 500 occur through the edge connector of circuit board 103. Signals are shared by the two boards using a plurality of interconnecting pins. Each end of each pin is located in a plated through hole to provide electrical connections between the boards. These pins also physically attach the second board to the first board. An example of a piggy-back mounted circuit board (not using plated through holes) is provided in U.S. Pat. No. 5,200,917 to Shaffer et al.

In this embodiment, first memory bank portion 210 is formed from the front side of each of circuit boards 103,500. For example, SDRAM chips D0–D8 and D27–D35 can be used to implement first memory bank portion 210. Similarly, the back side of each circuit board 103,500 can be used to implement second memory bank portion 212. This includes, for example, SDRAM chips D9–D17 and D18–D26. The chips on each circuit board 103 and 500 include on-board clocking and buffering via clock drivers 218A,218B and address and control buffers 214A,214B,216A,216B. However, in this embodiment, each SDRAM chip is coupled to a 4-bit data path rather than an 8-bit data path. Thus, a corresponding SDRAM chip from each board is used to form the 8-bits provided by a single chip in the 36 megabyte DIMM. As in the 36 megabyte DIMM embodiment of FIG. 4, all SDRAM chips D0–D35 are addressed simultaneously. A bank select signal (one of signals A[19:0]) is used to select between memory bank portion 210 and memory bank portion 212.

V. DIMM Chip Layout

Figure 6A:
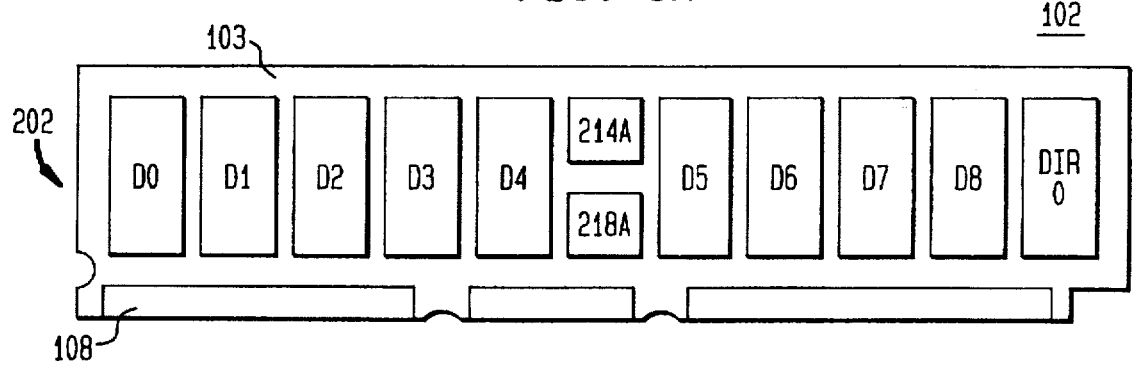
FIG. 6A is front plan view of a SDRAM DIMM according to the present invention.
Figure 6B:
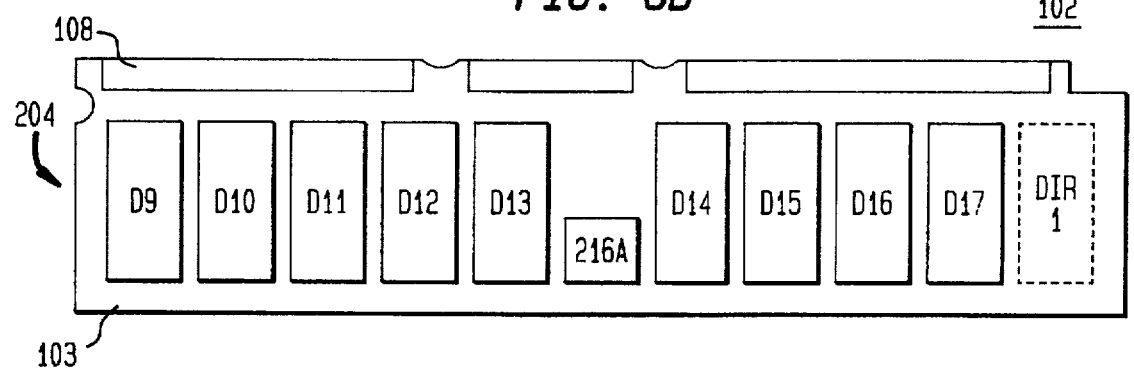
FIG. 6B is back plan view of the SDRAM DIMM of FIG. 6A.

A preferred implementation of the 32 megabyte DIMM embodiment is depicted in FIGS. 6A and 6B. FIG. 6A shows front side 202 of DIMM 102. FIG. 6B shows back side 204 of DIMM 102. In this preferred implementation, circuit board 103 is approximately 1.34 inches high by 6.6 inches long and includes a 122 pad long by 2 pad wide edge connector along one longitudinal edge of the circuit board. SDRAMs D0–D8, SDRAM DIR0 (for state memory 106), data and control buffers 214A and clock driver 218A are mounted on the front side 202 of circuit board 103. SDRAMs D9–D17 and data and control buffer 216A are mounted on the back side 204 of circuit board 103.

FIGS. 6A and 6B are representative of the 72 megabyte embodiment of the invention as well as the 32 megabyte embodiment with the following differences. First, in the 72 megabyte embodiment, SDRAMs D0–D17 are 4M×4 devices instead of 2M×8 bit devices. Second, the directory memory chip (indicated as DIR 0) is a 2M×8 bit device instead of a 1M×16 bit device. Third, in the 72 megabyte embodiment, a second 2M×8 bit SDRAM chip (indicated by dashed lines in FIG. 6B as DIR 1) is used with DIR 0 to implement state memory 106.

Figure 7A:
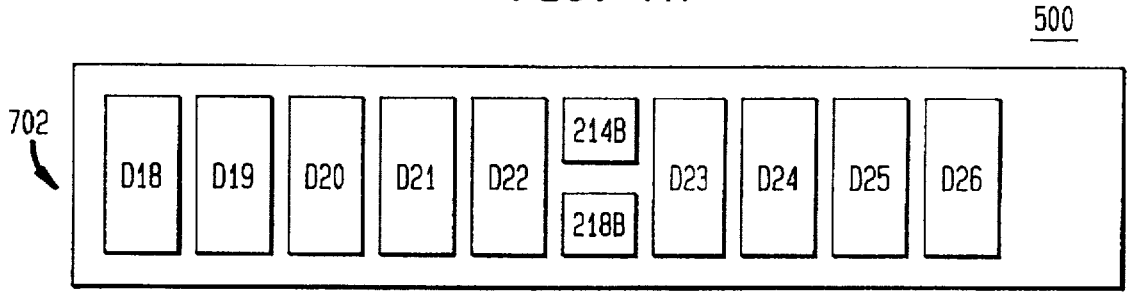
FIG. 7A is front plan view of a SDRAM DIMM piggy-back board according to the present invention.
Figure 7B:
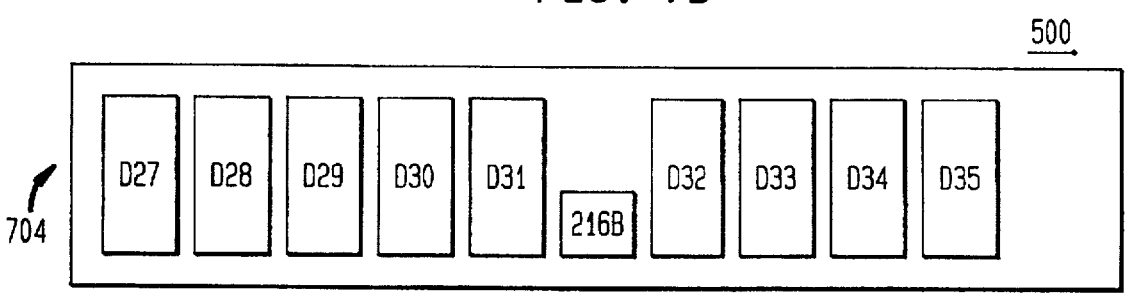
FIG. 7B is back plan view of the SDRAM DIMM piggy-back board of FIG. 7A.

A preferred implementation of the piggy-backed second circuit board 500 of the 72 megabyte DIMM embodiment is depicted in FIGS. 7A and 7B. FIG. 7A shows a front side 702 of second circuit board 500. FIG. 7B shows a back side 704 of second circuit board 500. In this preferred implementation, circuit board 500 is approximately 1.16 inches high by 6.6 inches long and includes 116 interconnecting pins (not shown) providing electrical connections with circuit board 103. SDRAMs D18–D26, data and control buffer 214B and clock driver 218B are mounted on the front side 702 of circuit board 500. SDRAMs D27–D35 and data and control buffer 216B are mounted on the back side 704 of circuit board 500.

VI. The Pad Description

Table 1 lists the pad name and functions for the edge connector's pads according to a preferred embodiment of the present invention. The left-hand column lists the abbreviated pad names and the right-hand column lists the function of the pads listed in the associated row of the table.

TABLE 1

Pad Description

| Pad Name | Function |
| --- | --- |
| A[11:0]$^A$ | Data Memory Address (Row:A[10:0]; Col:A[9:0]; Bank select: A11) |
| DQ[71:0] | Data I/O Pads for Data Memory |
| CS1_, CS0_$^A$ | Chip select for Data Memory SDRAMs |
| RE_$^A$ | Row address strobe (RAS) command for Data Memory |
| CE_$^A$ | Column address strobe (CAS) command for Data Memory |
| WE_$^A$ | Write enable command for Data Memory |
| DQM$^A$ | Input/Output mask for Data Memory |
| CKE1, CKE0$^A$ | Memory clock enable for CS1 and CS0 SDRAM's respectively |
| DIR_A[11:0]$^B$ | State Memory Address (Row:A[10:0]; Col:A[7:0]; Bank select: A11) |
| DIR_DQ[15:0] | Directory data (i.e., state information) I/O for State Memory |
| DIR_CS_$^B$ | Directory chip select for State Memory |
| DIR_RE$^B$ | Directory row address strobe command for State Memory |
| DIR_CE$^B$ | Directory column address strobe command for State Memory |
| DIR_WE_$^B$ | Directory write enable command for State Memory |
| DIR_DQM$^B$ | Directory input/output mask for State Memory |
| DIR_CKE$^B$ | Directory clock enable for State Memory |
| PCLK, PCLK_$^C$ | Differential LVPECL clock inputs |
| TCLK$^C$ | LVTTL clock inputs |
| TCLK_SEL$^C$ | Selects TCLK when high and PCLK when low |
| PLL_EN$^C$ | Enables PLL on clock driver |
| PLL_CLR$^C$ | PLL reset and tri-state clock driver outputs |
| V3 | Power supply (3.3 VD.C.) |
| GND | Ground |
| SERIAL_DAT | Line to read contents of serial prom |

$^A$ = These pads are shown collectively on FIGS. 4 and 5 as A[19:0]
$^B$ = These pads are shown collectively on FIGS. 4 and 5 as B[17:0]
$^C$ = These pads are shown collectively on FIGS. 4 and 5 as C[5:0]

The first pad description is for the address pads and is abbreviated A[11:0]. During row addressing the eleven least significant bits are used. During column addressing the nine least significant bits are used in the 36 MB DIMM embodiment, and the ten least significant bits are used in the 72 MB DIMM embodiment. The most significant bit (A11) is used to select between internal SDRAM banks. (These "internal banks" are different banks than banks zero and bank one of SDRAM DIMM 102 described above. Therefore, banks zero and one will hereafter be referred to as "external" banks that are selected via external back chip select signals CS1 and CS0, to distinguish them from the "internal SDRAM bank select" signal A11. This naming convention applies for SDRAMs used for data, as well as those used to store state information.)

Data is input to, and output from the data memory of the SDRAM DIM via 72 data input/output (I/O) paths abbreviated DQ[71:0]. Since the SDRAM DIMMs are used in pairs, a single access of the data memory on a single DIMM provides 72 bits, which when concatenated with 72 bits of the paired DIMM, yields a 144 bit data word that includes 128 bits of data an 16 bits of ECC.

There are eight remaining paths for the data memory of the SDRAM DIMM. Two external bank chip select pads abbreviated CS1_ and CS0_, a row address strobe command pad abbreviated RE_, a column address strobe command pad abbreviated CE_ and a write-enable command pad abbreviated WE_ are standard signals used for selecting, addressing, and write-enabling SDRAM chips, as would be apparent to a person skilled in the relevant art. Similarly, two pads are provided for memory clock enable for the two banks of SDRAMs, respectively, and are abbreviated CKE1 and CKE0. A single input/output mask path is also provided, and is abbreviated DQM. The function of the DQM mask pad will be described below in connection with the waveform diagrams.

The pads for the state memory of the SDRAM DIMM will now be described. The collection of directory address pads are abbreviated DIR_A[11:0]. Row addressing for the state memory uses directory address bits A[10:0] and column addressing utilizes directory address bits A[7:0] for a 32 MB DIMM and bits A[8:0] for a 72 MB DIMM. A twelfth directory address pad (A11) is used for internal SDRAM bank selection.

Sixteen bits of state information is provided by directory data I/O pads abbreviated DIR DQ[15:0]. The next five pads listed in Table 1 have similar functionalities as described above in connection with the analogous paths for the data memory section of the SDRAM DIMM. The directory chip select pad is abbreviated DIR_CS_. A directory row address strobe command pad is abbreviated DIR_RE_. A directory column address strobe command pad is abbreviated DIR_CE_. A directory write-enable command pad is abbreviated DIR_WE_. A directory input/output mask pad is abbreviated DIR_DQM. An additional directory clock-enable pad, abbreviated DIR_CKE, is provided for enabling the state memory clock.

According to a preferred embodiment of the present invention, a Motorola, Inc., (Phoenix, Ariz.) MPC931 PLL chip, is used as a clock driver circuit. Because this specific integrated circuit supports both low voltage transistor-transistor-logic (LVTTL) or low voltage positive emitter coupled logic (LVPECL) respectively, the SDRAM DIMM of the present invention can include pads to facilitate either type of logic level for the clock driver circuit. Therefore, differential LVPECL clock pads abbreviated PCLK and PCLK_ are provided. Additionally, a LVTRL clock pad abbreviated TCLK is also provided. To select between the two possible power pad inputs, a select pad abbreviated TCLK_SEL is provided. The logical voltage value applied to the TCLK_SEL pad will select which voltage pads that the clock driver circuit will use. For example, the TCLK can be selected when the TCLK_SEL pad is a logic high and the PCLK pad can be used for powering the clock driver circuit when the TCLK_SEL pad is at a low logic level. Another pad enables the phase lock loop portion of the clock driver circuit, and is abbreviated PLL_EN. Reset and tri-state clock driver circuit outputs for this manufacturers' chip can be selected via another pad abbreviated PLL_CLR. Other suitable pad arrangements using functionally similar PLL (phase locked loop) chips would be apparent to a person skilled in the relevant art.

A power supply voltage (e.g., 3.3 V.D.C.) and ground are supplied via pads abbreviated V3 and GND respectively. If implemented, a single additional pad is used to read the contents of the serial programmable read-only memory (PROM), which is labeled SERIAL_DAT. FIG. 15 illustrates a preferred exemplary pad assignment for the entire 244 connector pad edge connector 108. This figure is broken-down into 6 columns in order to show all 244 pad assignments on a single page. 14 pads are unassigned. Each column shows the pad number assignment followed by the abbreviation of the pad description corresponding to the pad names listed in Table 1. The pad assignments are made taking trace lengths on the PCB 103 into consideration to minimize signal skew and loading.

VII. Timing Requirements

Table 2 shows representative timing requirements for an exemplary SDRAM DIMM pair using NEC Corporation (Japan) part numbers uPD4516421GS-A12-TJF (4M×4), uPD4516421GS-A12-TJF (2M×8) or uPD45161GS-A12-TJF (1M×16). The timing requirements listed in Table 2 are for nominal temperatures between 0° and 70° C. and a power supply voltage of between 3.3 volts and 3.6 V.D.C., with all clock references to PCLK. The timing requirements of Table 2 include clock jitter and skew of approximately 1.5 nanoseconds.

TABLE 2

Timing Requirements
(Ta = 0 to 70 C, VDD, VDDQ = 3.15 VDC to 3.6 VDC)
All clock references (Ref) are to PCLK.
The timings include a clock jitter + skew of 1.5 ns max 1. Clock cycle time = 20 ns max
2. Clock to data in setup = 4.5 ns min
3. Clock to data in hold = 2.5 ns min
4. Set up time input address = 12.0 ns min
5. Hold time input address = 1.0 ns min
6. Set up time input command = 12.0 ns min
7. Hold time input command = 1 ns min
8. Access time from clock (CAS latency = 2) = 15 ns max, load 80 pf
9. Hold time output data = 1.5 ns min
10. Clock to data out, high impedance = 16.5 ns max, load 80 pf
11. Clock to CKE setup (power down exit) = 12.0 ns max
12. Clock to CKE hold = 1.0 ns min
13. Ref/active to Ref/active command period = 110 ns min
14. Active to precharge command period = 75 ns min–10000 ns max
15. Active command to column command (same bank) = 38 ns min
16. Precharge to active command period = 38 ns min
17. Last data in to precharge lead time = 18 ns min
18. Refresh period = 64 ms max The timing parameters shown in Table 2 generally represent time periods as measured at the edge connector, ignoring any small effects the connector itself will have on the signals. These times would appear different if measured at a location on the SDRAMs themselves. The row and column addresses are set by a memory system into which the SDRAM DIMMs are connected and as required by the specific SDRAM devices employed on the DIMMs.

VIII. Waveform Diagrams

Figure 8:
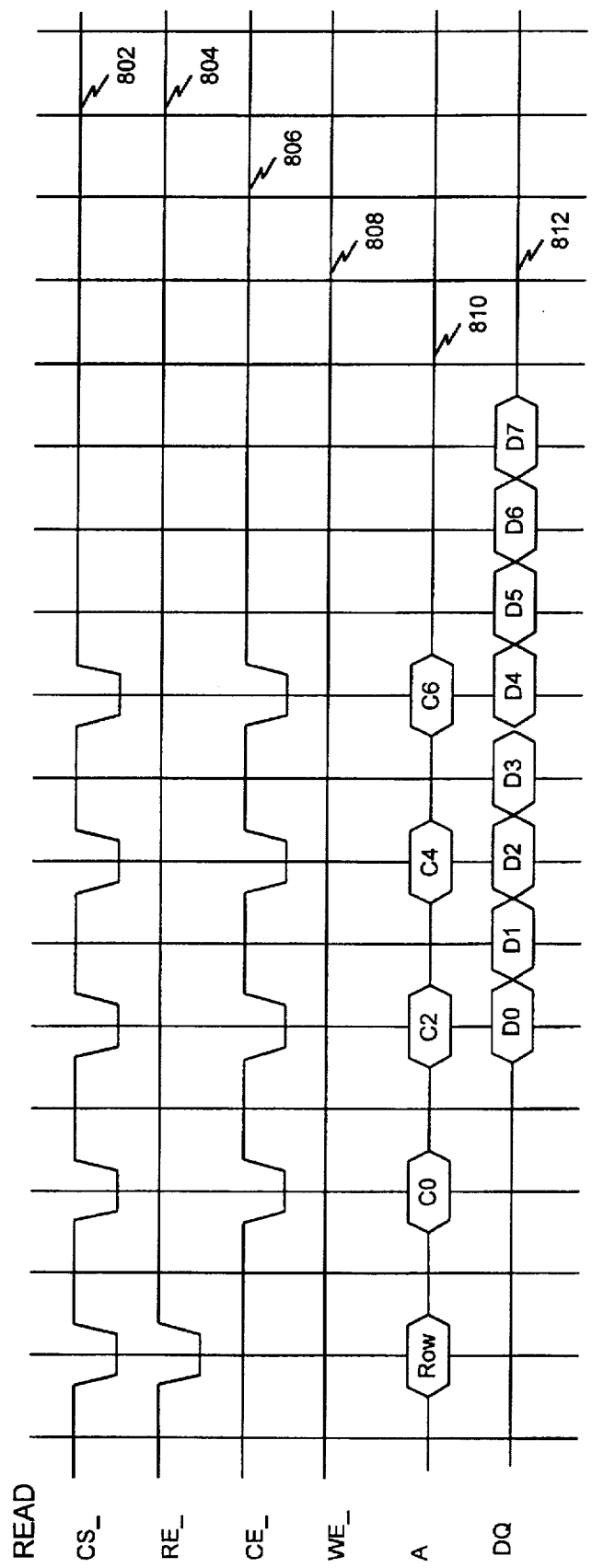
FIG. 8 illustrates a representative data read timing diagram according to the present invention.
Figure 9:
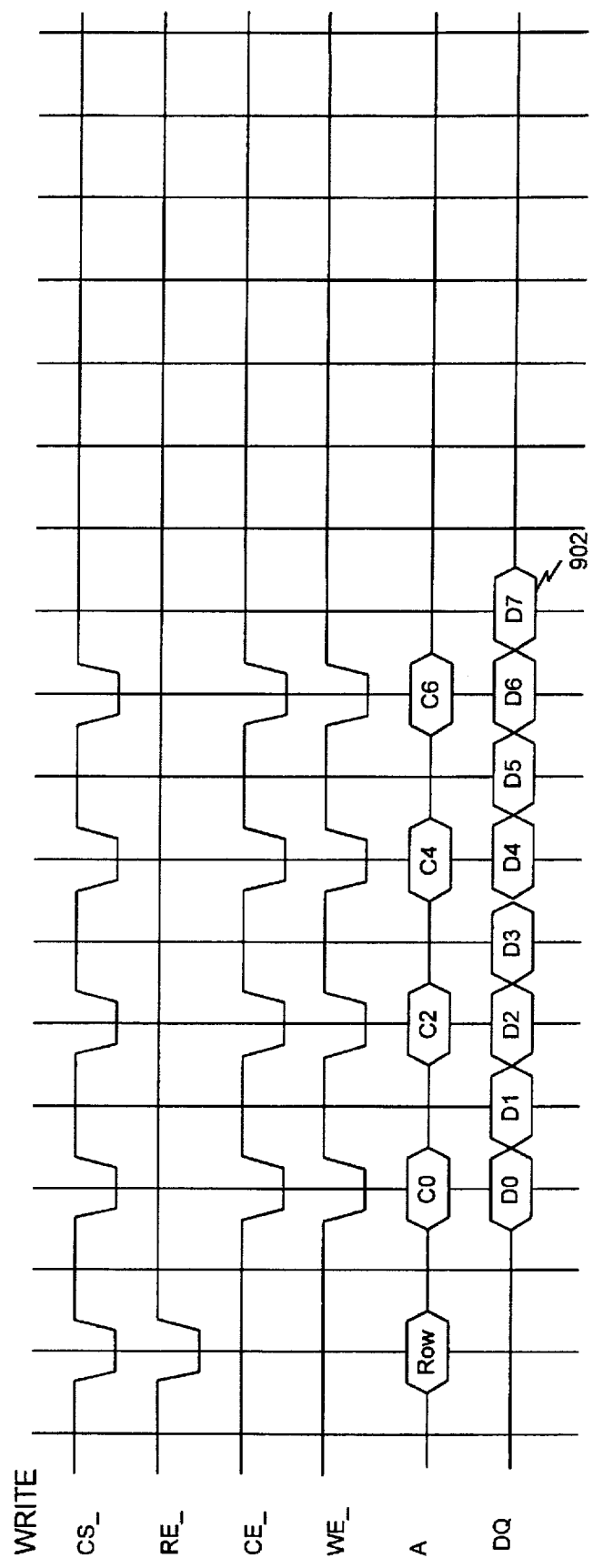
FIG. 9 illustrates a representative data write timing diagram according to the present invention.
Figure 10:
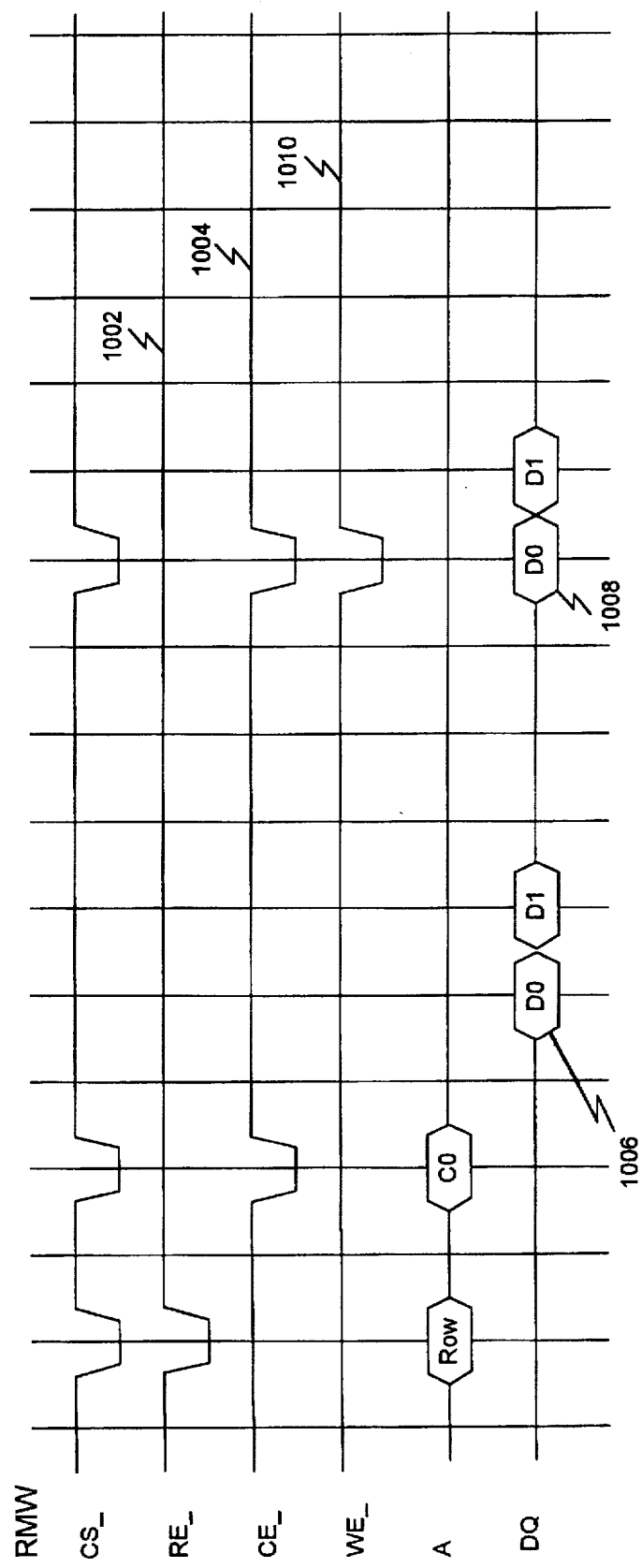
FIG. 10 illustrates a representative read/modify/write timing diagram according to the present invention.

The timing diagrams for reading and writing information for the SDRAM DIMM are shown in FIGS. 8–13. FIG. 8 shows a representative "data read" timing diagram according to the present invention. FIG. 9 shows a representative "data write" timing diagram according to the present invention. FIG. 10 shows a representative "read modify write" (RMW) timing diagram according to the present invention. The vertical bars represent clock edges, at which the control and address signals are sampled by the SDRAM parts.

Turning now to FIG. 8, a total of six timing traces are illustrate, including: chip select (CS__) 802; row address strobe (RE__) 804; column address strobe (CE__) 806; write-enable (WE__) 808; address (A) inputs 810; and, data (DQ) inputs/outputs 812.

The SDRAM DIMMs data output 812 represents the timing of an output based on application of the row and column addresses and assertion of the RE__, CE__ and WE__ control signals. The data memory is arranged so that a single row access can be followed by four column addresses (C0, C2, C4 and C6) to access a block of data from a DIMM pair. A block of data (not including parity/ECC data) is 8 words by 16 bytes, or a total of 128 bytes (which is 64 bits per DIMM or a total of 128 bits per location access, since the pair is accessed in parallel). So for 4 consecutive location accesses per RA, a total of 8 data words D0–D7 by 16 bytes are output. Similarly, the SDRAM DIMM pair is written to in block writes as illustrated by trace 902 in FIG. 9. Table 3 shows representative cycle latency for various timing parameters of FIGS. 8–10. These parameter latencies are listed in nanosecond and are nominal.

TABLE 3

Cycle Latency at 50 MHZ

1. CAS latency = 2 (number of clocks between CE__ command and data is available).
2. tRCD = 2 (minimum number of clocks between RE__ and CE__ commands).
3. RAS latency = 4 (minimum number of clocks between RE__ and data is available).
4. tRC = 6 (minimum number of clocks between refresh and RE__ command).
5. tRAS = 4 (minimum number of clocks between RE__ and precharging).
6. tRRD = 2 (minimum number of clocks between RE__ commands).
7. tRP = 2 (minimum number of clocks between precharging and RE__ command).
8. tDPL = 1 (minimum number of clocks between data in and precharging command).
9. tDAL = 3 (minimum number of clocks between data in and RE__ for auto-precharging).

Read modify writes can also be done on data, as shown in FIG. 10. A location is accessed by a single RE__ and CE__ (traces 1002 and 1004 respectively) and the data is read at the first D0/D1 pair 1006. After the data is modified it is written back as shown by the second D0/D1 pair (1008) to the DIMM pair by asserting the CE__ and the WE__ (trace 1010) signals.

As noted above, the state memory is accessed in parallel with the data memory. A state memory comprises two reads and two writes, since each directory entry is 32 bits wide, and each state memory in the preferred embodiment implements SDRAMs that are only 16 bits deep. Also, page migration incrementing requires reading the location that corresponds to the block being accessed for both the node making the request and the home node, and a write to increment the count for the node making the request. The page migration counts keep track of the number of times a node accesses a particular page of memory. Thus, that count must be incremented each time a page is accessed. If the count for some node accessing a given page exceeds either a predetermined threshold or the count for the requestor minus the count for the home node exceeds another threshold, the page is migrated to the memory associated with that node. A more detailed description of page migration is found in the co-pending application (Attorney Docket No. 1452.0690000) noted above. Thus, during the 8 cycle read or write of the data memory, the corresponding state memory is read a total of 4 times and written to a total of 3 times, so that accesses to the data and state information is balanced.

Figure 11:
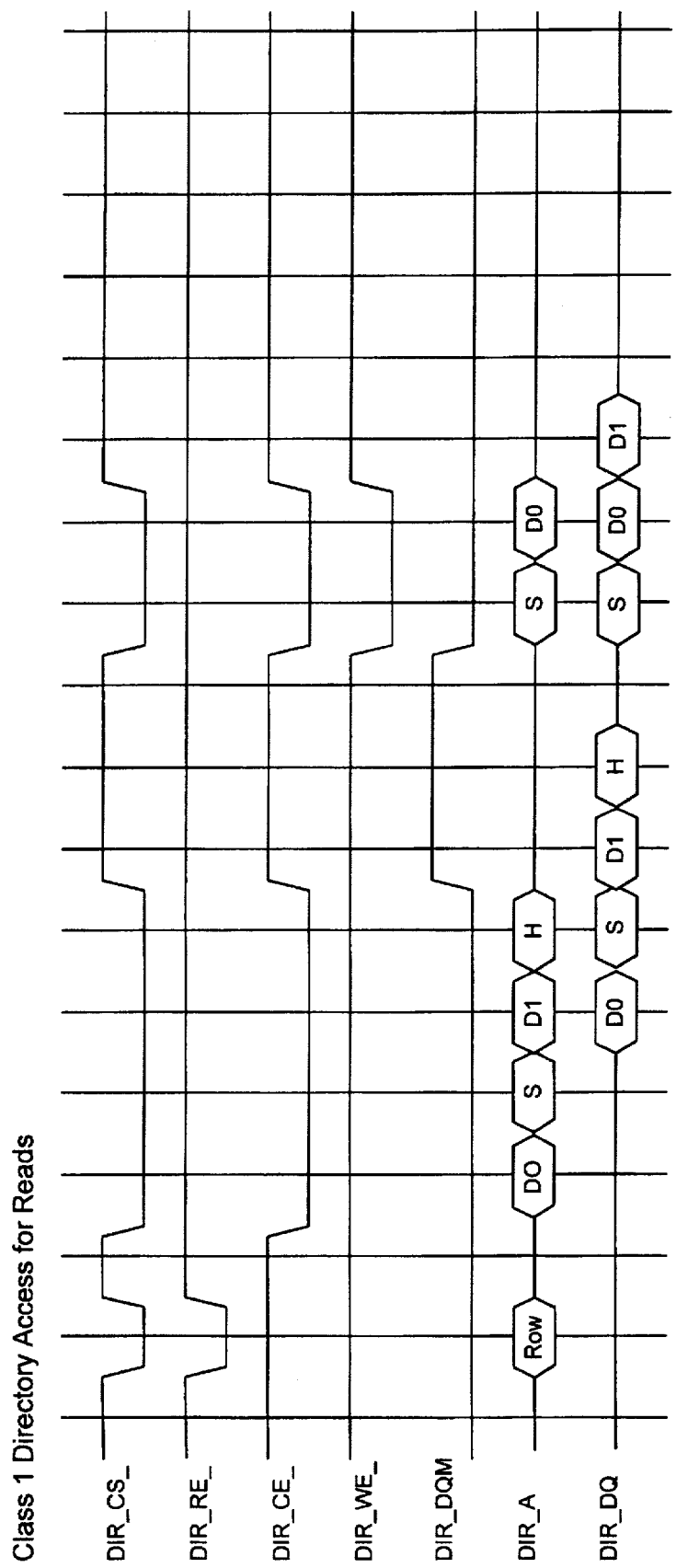
FIG. 11 illustrates a representative state memory timing diagram for a memory read according to the present invention.
Figure 12:
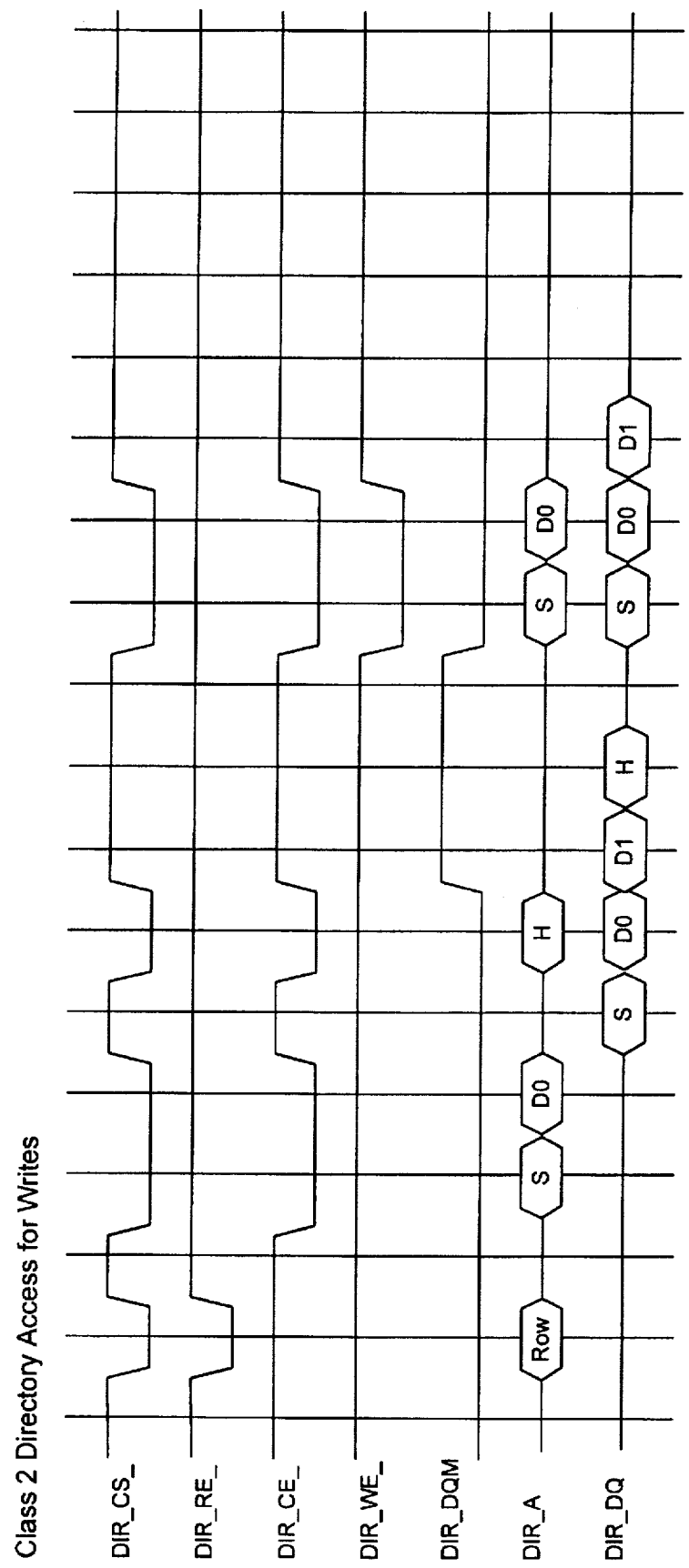
FIG. 12 illustrates a representative state memory timing diagram for a memory write or read-modify-write according to the present invention.
Figure 13:
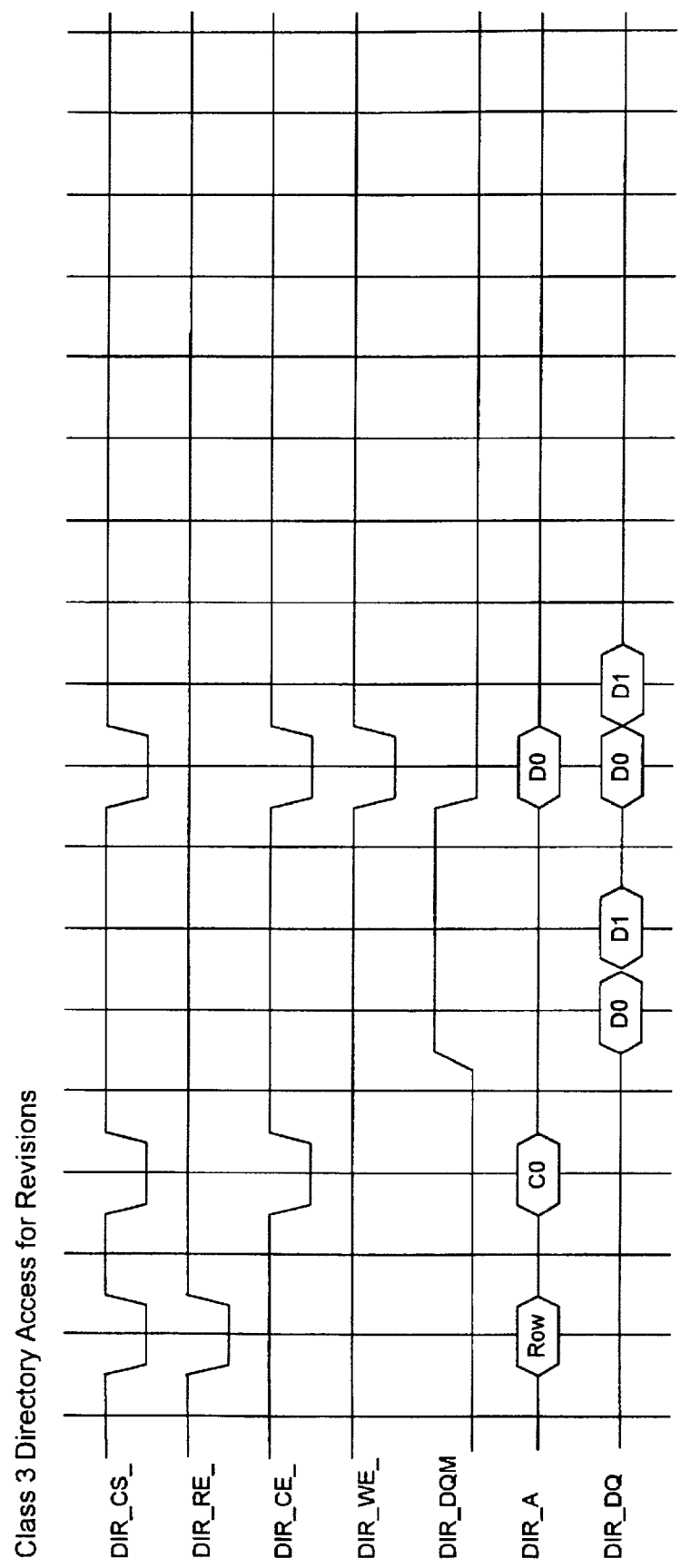
FIG. 13 illustrates a representative state memory timing diagram for operation of a state memory-only DIMM according to the present invention.

FIGS. 11, 12 and 13 show three separate waveform diagrams involving data masking, including reads, writes, and revisions, respectively. In FIG. 11 the following signals are shown: chip select (DIR__CS__), row address strobe (DIR__RE__), column address strobe (DIR__CE__), write enable (DIR__WED__), input/output data masks (DIR__DQM__), address A inputs and data (DIR__DQ) input/outputs. The directory cycle for a read starts by reading the first half of the directory word (D0), the page migration count for the requesting node (S), the second half of the directory word (D1), the home node's page migration count (H), then after a dead cycle on DIR__DQ, the new page migration count (S) and the new directory information (D0 and D1) are written into the state memory. The information is read out in the listed order due to requirements of the memory controller that lead to the quickest memory response time.

FIG. 12 is a slight permutation of the waveforms shown in FIG. 11. The order of S and D0 are switched in this figure in contrast to FIG. 11.

FIG. 13 shows the state access for a state revision operation, which is a state-only access and does not require a memory access. To minimize the overhead of these revisions operations only the directory information is accessed.

XI. Expanded State Memory

When used in a DSM multiprocessor, the DIMM pairs of the invention are used to implement main memory. Each processor node of the DSM multiprocessor includes a portion of main memory. In the 36 megabyte and 72 megabyte embodiments of the DIMM, the state memory configurations discussed provide sufficient capacity to accommodate the state information required for a system having 16 nodes. For example, each state memory described above includes 16 bit wide words of state information.

When the number of nodes exceeds 16, additional state memory is required at each node to accommodate more state information about caching, because more cache memories are likely added to the system. The additional state memory can be provided by using a state memory-only DIMM. According to a preferred embodiment of this aspect of the present invention, this state memory-only DIMM adds 32 bits of additional state memory. The resulting total state memory provides 48 bit wide words of state information (16 original bits on the SDRAM data/state memory DIMM plus 32 bits from the state memory-only DIMM). With the additional state memory, the DSM multiprocessor can accommodate up to 64 nodes using conventional bit-vectors and up to 512 nodes using flexible directory bit vectors. The specific number of additional state information bits can vary and is extendable, as would be apparent to a person of ordinary skill in the relevant art.

Figure 14:
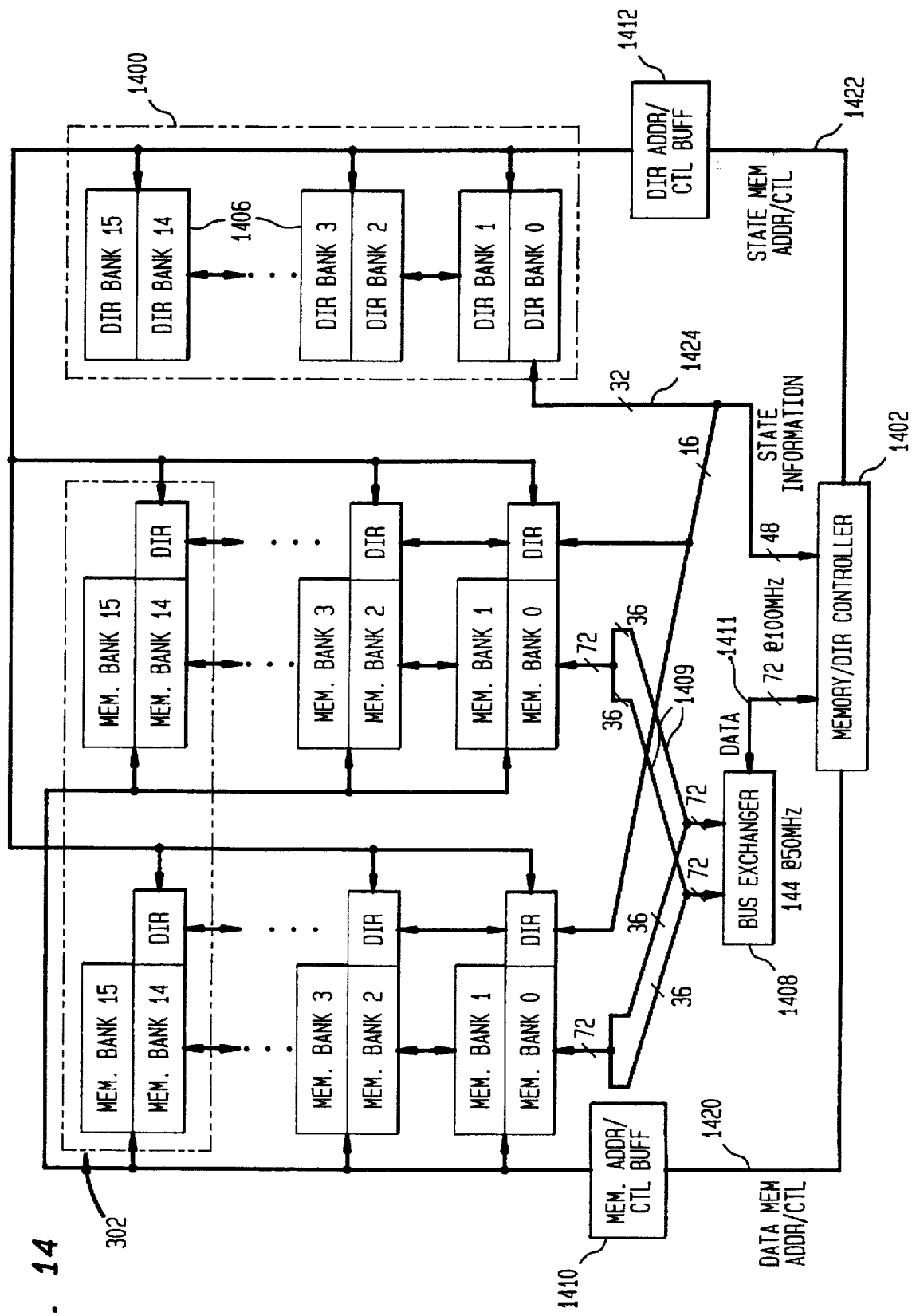
FIG. 14 illustrates the organization of DIMM pairs and state memory-only DIMMs in a node of a DSM multiprocessor

The organization of DIMM pairs 302 and state memory-only DIMMs 1406 in a main memory portion 1400 of a node of a DSM multiprocessor is illustrated in FIG. 14. A memory/directory controller 1402 at the node of the DSM multiprocessor performs all memory management functions for the data and state memory on the DIMMs 302 and 1406. A memory address and control buffer 1410 buffers all address and control lines 1420 going to the data memories of the DIMM pairs 302 from the controller 1402. A state (directory) address and control buffer 1412 buffers all address and control signals on lines 1422 going to the state memories of the state memory-only DIMM pairs 1406 from the controller 1402.

Each state memory-only DIMM 1406 can be implemented using a single PCB. The PCB can be populated with SDRAM chips of similar or dissimilar capacity chips as the SDRAMs of the DIMMs 302. The SDRAMs of the state memory-only DIMMs 1406 are organized with two banks of state memory so that state information and addressing of the state information is consistent with the directory (DIR)/state memories on the DIMMs 302.

A bus exchanger 1408 passes the 144 bit data word to/from each DIMM pair 302 via bidirectional buses 1409. The bus exchange 1408 takes 144 bits data at the memory speed and converts it to 72 bits at twice the memory speed. In a preferred embodiment, the bus exchanger 1408 is implemented with a part number SN74ALVC16282 (manufactured by Texas Instruments, Dallas Tex.) that converts 144 bits at 50 MHz to 72 bits at 100 MHz, and vice versa for bidirectional transfer of the data between the DIMMS 302 and the controller 1402, via bidirectonal bus 1411. Directory data is not buffered, and is transferred between the state memory-only DIMMs 1406 and the controller 1402 via bidirectional bus 1424.

For purposes of illustration, a 36 megabyte embodiment and a 72 megabyte embodiment of the DIMM have been described. It should be understood, however, that the DIMM of the invention may be produced in other data capacities. For example, using 64 megabit (i.e., 8M×8) SDRAM chips, a single board DIMM may be produced having 128 megabyte data and 16 megabyte ECC (18 chips×8 megabytes per chip) storage capacity (including data and ECC). This would yield a DIMM pair having 256 megabytes of data storage capacity. If a piggy-back board is used as in the 72 megabyte DIMM embodiment described above, the 64 megabyte SDRAM chips can be used to implement a 256 megabyte data and 32 megabyte ECC DIMM and a 512 megabyte data, 64 megabyte ECC DIMM pair.

In the preferred embodiment described, a piggy-back board is used to allow the DIMM to accommodate 36 SDRAMs for the data memory. A person skilled in the art will recognize that chip stacking techniques may also be used to accommodate 36 SDRAM chips. If chip stacking techniques are used, the piggy-board may be eliminated.

Alternatively, 4 megabit (i.e., 1M×1) SDRAM chips can be combined to produce DIMMs with lower storage capacity, or the above-described stacking and/or piggy-back techniques can be used for higher storage capacity.

X. Conclusion

While various embodiments of the present invention have been described above, it should be understood that they have been presented by way of example, and not limitation. It will be apparent to person skilled in the revelant art that various changes in form and detail can be made therein without departing from the spirit and scope of the invention. Thus the present invention should not be limited by any of the above-described exemplary embodiments, but should be defined only in accordance with the following claims and their equivalents. All cited patent documents and publications in the above description are incorporated herein by reference.

What is claimed is:

1. A dual in-line memory module (DEI) comprising:

a circuit board having a connector;

first memory means for storing data, wherein said first memory means includes at least one semiconductor memory chip mounted on said circuit board, said at least one semiconductor memory chip is coupled to said connector by a first data path and a first address path; and second memory means for storing directory information, wherein said second memory means includes at least one further semiconductor memory chip mounted on said circuit board and said at least one further semiconductor memory chip is coupled to said connector by a second data path and a second address path;, wherein said first and second data paths and said first and second address paths permit said first memory means and said second memory means to be accessed separately.

2. The DIMM of claim 1, wherein said second memory means stores directory information corresponding to at least a portion of said data.

3. The DIMM of claim 1, wherein said connector comprises:

a first group of address pads coupled to said first address path, a second group of address pads coupled to said second address path, a first group of data pads coupled to said first data path, and a second group of data pads coupled to said second data path.

4. The DIMM of claim 3, wherein said connector further comprises:
   a first set of control pads for said first memory means, and
   a second set of control pads for said second memory means.

5. The DIMM of claim 4, wherein each of said first and second sets of control pads include row access strobe pads, column access strobe pads, chip enable pads and write enable pads.

6. The DIMM of claim 3, wherein said first group of address pads includes at least 12 pads.

7. The DIMM of claim 3, wherein said second group of address pads includes at least 12 pads.

8. The DIMM of claim 3, wherein said first group of data pads includes at least 72 pads.

9. The DIMM of claim 3, wherein said second group of data pads includes at least 16 pads.

10. The DIMM of claim 3, wherein said connector is an edge connector having two sides and at least 122 pads per side.

11. The DIMM of claim 4, wherein said first memory means and said second memory means each comprise a plurality of synchronous dynamic random access memory (SDRAM) chips.

12. The DIMM of claim 11, wherein said first memory means is divided into a first memory bank portion of SDRAM chips and a second memory bank portion of SDRAM chips.

13. The DIMM of claim 12, wherein said first memory bank portion and said second memory bank portion each comprises at least nine (9) SDRAM chips.

14. The DIMM of claim 13, wherein each of said at least nine (9) SDRAM chips is two megabits (2M) deep and eight (8) bits wide.

15. The DIMM of claim 14, wherein said second memory means comprises at least one one megabit (1M) deep by sixteen (16) bit wide SDRAM chip.

16. The DIMM of claim 12, wherein said first memory bank portion and said second memory bank portion each comprise at least eighteen (18) SDRAM chips.

17. The DIMM of claim 16, wherein each of said at least eighteen (18) SDRAM chips is four megabits (4M) deep and four (4) bits wide.

18. The DIMM of claim 17, wherein said second memory means comprises at least two two megabit (2M) deep by eight (8) bit wide SDRAM chips.

19. The DIMM of claim 18, wherein said printed circuit board comprises a first circuit board supporting a second circuit board in a parallel, piggy back configuration.

20. The DIMM of claim 16, wherein each of said at least eighteen (18) SDRAM chips is sixteen megabits (16M) deep and four (4) bits wide, and said first group of address pads includes at least 14 pads.

21. The DIMM of claim 20, wherein said second memory means comprises at least two eight (8M) deep by eight (8) bit wide SDRAM chips.

22. The DIMM of claim 1, wherein said first memory means and said second memory means each comprise a plurality of dynamic random access memory (DRAM) chips.

23. The DIMM of claim 1, further comprising a phase locked loop clock driver coupled to said first and second memory means.

24. The DIMM of claim 1, further comprising a buffer for buffering address and control signals for said first memory means.

25. The DIMM of claim 1, further comprising a programmable read only memory to store information identifying the DIMM.

26. The DIMM of claim 1, wherein said first memory means is logically organized into memory blocks, and said second memory means is configured for storing information about where data stored in a group of said memory blocks is cached.

27. The DIMM of claim 1, wherein said first memory means is logically organized into memory blocks, and said second memory means is configured for storing access rights for the data stored in a group of said memory blocks.

28. The DIMM of claim 1, wherein said first memory means is logically organized into memory blocks, and said second memory means is configured for storing cache state information about data stored in a group of said memory blocks.

29. A dual in-line memory module (DIMM) comprising:
   a circuit board having a connector; and
   a plurality of semiconductor memory chips mounted on said circuit board and organized into a first memory bank portion and a second memory bank portion, wherein said first memory bank portion is coupled to said connector via a first data path and a first address path, and said second memory bank portion is coupled to said connector via a second data path and a second address path so that said first and second memory bank portions are separately addressable.

30. The DIMM of claim 29, wherein said connector comprises a plurality of pads, said pads including
   a first group of address pads,
   a second group of address pads,
   a first group of data pads, and
   a second group of data pads.

31. The DIMM of claim 30, wherein said plurality of pads has the following arrangement:
   said first group of data pads and said first group of address pads are electrically coupled to said data memory; and
   said second group of data pads and said second group of address pads are electrically coupled to said state memory,
   wherein said arrangement permits independent addressing of said data memory and said state memory.

32. The DIMM of claim 31, wherein said data memory and said state memory each comprise a plurality of synchronous dynamic random access memory (SDRAM) chips.

33. The DIMM of claim 32, wherein said data memory is divided into a first memory bank portion of SDRAM chips and a second memory bank portion of SDRAM chips.

34. The DIMM of claim 33, wherein said first memory bank portion and said second memory bank portion each comprise at least nine (9) SDRAM chips.

35. The DIMM of claim 34, wherein each of said at least nine (9) SDRAM chips is two megabits (2M) deep and eight (8) bits wide.

36. The DIMM of claim 35, wherein said state memory comprises at least one one megabit (1M) deep by sixteen (16) bit wide SDRAM chip.

37. The DIMM of claim 33, wherein said first memory bank portion and said second memory bank portion each comprise at least eighteen (18) SDRAM chips.

38. The DIMM of claim 37, wherein each of said at least eighteen (18) SDRAM chips is four megabits (4M) deep and four (4) bits wide.

39. The DIMM of claim 38, wherein said state memory comprises at least two two megabit (2M) deep by eight (8) bit wide SDRAM chips.

40. The DIMM of claim 39, wherein said printed circuit board comprises a first circuit board supporting a second circuit board in a parallel, piggy back configuration.

41. The DIMM of claim 37, wherein each of said at least eighteen (18) SDRAM chips is sixteen megabits (16M) deep and four (4) bits wide, and said first group of address pads includes 14 pads.

42. The DIMM of claim 41, wherein said state memory comprises at least two eight megabit (8M) deep by eight (8) bit wide SDRAM chips.

43. The DIMM of claim 30, wherein said plurality of pads further comprises separate control pads for said data memory and said state memory.

44. The DIMM of claim 43, wherein said control pads include row access strobe pads, column access strobe pads, chip enable pads and write enable pads.

45. The DIMM of claim 30, wherein said first group of address pads includes at least 12 pads.

46. The DIMM of claim 30, wherein said second group of address pads includes at least 12 pads.

47. The DIMM of claim 30, wherein said first group of data pads includes at least 72 pads.

48. The DIMM of claim 30, wherein said second group of data pads includes at least 16 pads.

49. The DIMM of claim 30, wherein said connector is an edge connector having two sides and at least 122 pads per side.

50. The DIMM of claim 29, wherein said plurality of semiconductor memory chips are mounted directly on said circuit board.

51. The DIMM of claim 29, wherein said first memory bank portion is organized into memory blocks for storing data and said second memory bank portion stores directory information for said memory blocks of said first memory bank portion.

52. The DIMM of claim 51, said second memory bank portion is configured to store said directory information to indicate, on a memory block-by-memory block basis, whether data stored in a group of said memory blocks has been cached.

53. The DIMM of claim 22, wherein said second memory bank portion is further configured to store said directory information to indicate, on said memory block-by-memory block basis, where data stored in a group of said memory blocks has been cached.

54. A dual in-line memory module (DIMM) comprising:
 a circuit board;
 a data memory mounted on said circuit board;
 a state memory mounted on said circuit board; and
 a connector coupled to said data memory and said state memory to permit independent addressing of said data memory and said state memory, said connector comprising a plurality of pads, including a first group of address pads, a second group of address pads, a first group of data pads, and a second group of data pads;
 wherein said first group of data pads and said first group of address pads are electrically coupled to said data memory and said second group of data pads and said second group of address pads are electrically coupled to said state memory to permit said data memory and said state memory to be accessed separately;
 wherein said connector is an edge connector having two sides and at least 122 pads per side, said first group of address pads including at least 12 pads, said second group of address pads including at least 12 pads, said first group of data pads including at least 72 pads, and said second group of data pads including at least 16 pads;

wherein said data memory and said state memory each comprise a plurality of dynamic random access memory (DRAM) chips, and said data memory is divided into a first memory bank portion of DRAM chips and a second memory bank portion of DRAM chips, and said first memory bank portion and said second memory bank portion each comprise at least nine (9) DRAM chips, and said state memory comprises at least one megabit (1M) deep by sixteen (16) bit wide DRAM chip.

55. The DIMM of claim 54, wherein said data memory is logically organized into memory blocks, and said state memory stores information about where data stored in a group of said memory blocks is cached.

56. The DIMM of claim 54, wherein said data memory is logically organized into memory blocks, and said state memory stores access rights for the data stored in a group of said memory blocks.

57. The DIMM of claim 54, wherein said data memory is logically organized into memory blocks, and said state memory stores cache state information about data stored in a group of said memory blocks.

58. The DIM of claim 54, wherein said data memory and said state memory each comprise a plurality of synchronous dynamic random access memory (SDRAM) chips.

59. The DIMM of claim 58, wherein each of said at least nine (9) SDRAM chips is two megabits (2M) deep and eight (8) bits wide.

60. The DIMM of claim 58, wherein said first memory bank portion and said second memory bank portion each comprise at least eighteen (18) SDRAM chips.

61. The DIMM of claim 60, wherein each of said at least eighteen (18) SDRAM chips is four megabits (4M) deep and four (4) bits wide.

62. The DIMM of claim 61, wherein said state memory comprises at least two two megabit (2M) deep by eight (8) bit wide SDRAM chips.

63. The DIMM of claim 60, wherein each of said at least eighteen (18) SDRAM chips is sixteen megabits (16M) deep and four (4) bits wide, and said first group of address pads includes 14 pads.

64. The DIMM of claim 60, wherein said state memory comprises at least two eight megabit (8M) deep by eight (8) bit wide SDRAM chips.

65. The DIMM of claim 54, wherein said DRAM chips are mounted directly on said circuit board.

66. A dual in-line memory module (DIMM) comprising:
 a circuit board;
 a data memory mounted on said circuit board;
 a state memory mounted on said circuit board, said state memory being separate and distinct from said data memory; and
 means for permitting independent and simultaneous access of said data memory and said state memory so that different operations to different locations of said data memory and said state memory can be done in parallel.

67. The DIMM of claim 66, wherein said means comprises a connector and first and second sets of busses on said circuit board.

68. The DIMM of claim 67, wherein said connector comprises a plurality of pads, said pads including:
 a first group of address pads,
 a second group of address pads,
 a first group of data pads, and
 a second group of data pads.

69. The DIMM of claim 68, wherein said plurality of pads has the following arrangement:

said first group of data pads and said first group of address pads are electrically coupled via said first set of busses to said data memory; and said second group of data pads and said second group of address pads are electrically coupled via said second set of buses to said state memory.

70. The DIMM of claim 66, wherein said data memory and said state memory each comprise a plurality of dynamic random access memory (DRAM) chips.

71. The DIMM of claim 66, further comprising a phase locked loop clock driver coupled to said data memory and said state memory.

72. The DIMM of claim 66, further comprising a buffer for buffering address and control signals for said data memory.

73. The DIMM of claim 66, further comprising a programmable read only memory to store information identifying the DIMM.

74. The DIMM of claim 66, wherein said data memory is logically organized into memory blocks, and said state memory is configured for storing information about where data stored in a group of said memory blocks is cached.

75. The DIMM of claim 66, wherein said data memory is logically organized into memory blocks, and said state memory is configured for storing access rights for the data stored in a group of said memory blocks.

76. The DIMM of claim 66, wherein said data memory is logically organized into memory blocks, and said state memory is configured for storing cache state information about data stored in a group of said memory blocks.

* * * * *

UNITED STATES PATENT AND TRADEMARK OFFICE
CERTIFICATE OF CORRECTION

PATENT NO. : 5,790,447

DATED : August 4, 1998

INVENTORS : Laudon *et al.*

It is certified that an error appears in the above-identified patent and that said Letters Patent is hereby corrected as shown below.

In Column 16, Line 38 (Claim 1), delete "(DEI)" and insert --(DIMM)-- in place thereof;

In Column 17, Line 22 (Claim 11), delete "4" and insert --3-- in place thereof;

In Column 17, Line 56 (Claim 21), insert --megabit-- between "eight" and "(8M)";

In Column 19, Line 39 (Claim 53), delete "22" and insert --52-- in place thereof.

Signed and Sealed this

Sixth Day of July, 1999

*Attest:*

Q. TODD DICKINSON

*Attesting Officer*   *Acting Commissioner of Patents and Trademarks*